(12) United States Patent
Akiyama et al.

(10) Patent No.: US 7,462,678 B2
(45) Date of Patent: Dec. 9, 2008

(54) FILM FORMING COMPOSITION, PROCESS FOR PRODUCING FILM FORMING COMPOSITION, INSULATING FILM FORMING MATERIAL, PROCESS FOR FORMING FILM, AND SILICA-BASED FILM

(75) Inventors: Masahiro Akiyama, Tsukuba-shi (JP); Seitaro Hattori, Tsukuba-shi (JP); Masaki Obi, Ageo-shi (JP); Koichi Hasegawa, Champaign, IL (US)

(73) Assignee: JSR Corporation, Tokyo (JP)

( * ) Notice: Subject to any disclaimer, the term of this patent is extended or adjusted under 35 U.S.C. 154(b) by 429 days.

(21) Appl. No.: 10/947,253

(22) Filed: Sep. 23, 2004

(65) Prior Publication Data

US 2005/0096415 A1    May 5, 2005

(30) Foreign Application Priority Data

Sep. 25, 2003   (JP)   ............................. 2003-333885
Sep. 25, 2003   (JP)   ............................. 2003-333886
Sep. 25, 2003   (JP)   ............................. 2003-333887

(51) Int. Cl.
*C08G 77/08*   (2006.01)
(52) U.S. Cl. ..................... 528/14; 528/16; 528/17; 528/37; 524/588; 428/447
(58) Field of Classification Search ............... 528/14, 528/16, 17, 37; 524/588; 428/447
See application file for complete search history.

(56) References Cited

U.S. PATENT DOCUMENTS

| | | | | |
|---|---|---|---|---|
| 5,684,085 | A | * | 11/1997 | Gee et al. ...................... 516/53 |
| 5,973,067 | A | * | 10/1999 | Nakamura et al. .......... 524/858 |
| 6,476,174 | B1 | * | 11/2002 | Lee et al. ...................... 528/29 |
| 6,623,711 | B2 | | 9/2003 | Lyu et al. ...................... 423/12 |
| 6,809,041 | B2 | | 10/2004 | Interrante et al. ........... 438/780 |
| 7,122,880 | B2 | * | 10/2006 | Peterson et al. ............. 257/632 |
| 2002/0098279 | A1 | * | 7/2002 | Lyu et al. ...................... 427/58 |
| 2005/0096415 | A1 | | 5/2005 | Akiyama et al. |
| 2006/0006541 | A1 | | 1/2006 | Tsuchiya et al. |
| 2006/0024980 | A1 | | 2/2006 | Tsuchiya et al. |

FOREIGN PATENT DOCUMENTS

| | | |
|---|---|---|
| EP | 1 160 848 A2 | 12/2001 |
| JP | 6-181201 | 6/1994 |
| JP | 2000-256621 | 9/2000 |
| JP | 2000-309753 | 11/2000 |
| JP | 2002-285086 | 10/2002 |
| JP | 2004-210579 | 7/2004 |
| WO | WO 2004/003059 A1 | 1/2004 |
| WO | WO 2004/092252 A1 | 10/2004 |

OTHER PUBLICATIONS

U.S. Appl. No. 11/432,345, filed May 12, 2006, Shiota.
U.S. Appl. No. 11/393,647, filed Mar. 31, 2006, Shiota.
U.S. Appl. No. 11/484,604, filed Jul. 12, 2006, Nakagawa et al.
U.S. Appl. No. 11/485,508, filed Jul. 13, 2006, Nakagawa et al.
U.S. Appl. No. 11/486,085, filed Jul. 14, 2006, Nakagawa et al.
U.S. Appl. No. 11/489,468, filed Jul. 20, 2006, Akiyama et al.
U.S. Appl. No. 11/580,959, filed Oct. 16, 2006, Akiyama et al.
U.S. Appl. No. 11/596,295, filed Nov. 13, 2006, Akiyama et al.
U.S. Appl. No. 11/596,188, filed Nov. 13, 2006, Akiyama et al.
"Starfire® SP-DEPCS", Starfire® Systems, www.starfiresystems.com, May 2005, p. 1.
"Starfire® SP-DMPCS", Starfire® Systems, www.starfiresystems.com, May 2005, p. 1.
"Specialty Chemicals", Starfire Systems, (1), p. 1.
"Specialty Chemicals", Starfire Systems, (2), p. 1.
"Internet Archive WayBack Machine", http://web.archive.org/web/*/http://www.starfiresystems.com, p. 1.
"Starfire Systems: Projects, Specialty Chemicals", http://web.archive.org/web/20011205120755/www.starfiresystems.com/projects/chemicals.html, p. 1-2.

* cited by examiner

*Primary Examiner*—Margaret G Moore
(74) *Attorney, Agent, or Firm*—Oblon, Spivak, McClelland, Maier & Neustadt, P.C.

(57) ABSTRACT

A process for producing a film forming composition, the process including hydrolyzing and condensing: (A) at least one silane compound selected from a compound (A-1) shown by the following general formula (1), a compound (A-2) shown by the following general formula (2), and a compound (A-3) shown by the following general formula (3), $$R_a Si(OR^1)_{4-a} \quad (1)$$

$$Si(OR^2)_4 \quad (2)$$

$$R^3{}_b(R^4O)_{3-b}Si-(R^7)_d-Si(OR^5)_{3-c}R^6{}_c \quad (3); \text{ and}$$

(B) a cyclic silane compound shown by the following general formula (4):

$$\left[ \begin{array}{c} X \\ | \\ Si-O \\ | \\ Y \end{array} \right]_n \quad (4)$$

16 Claims, No Drawings

FILM FORMING COMPOSITION, PROCESS FOR PRODUCING FILM FORMING COMPOSITION, INSULATING FILM FORMING MATERIAL, PROCESS FOR FORMING FILM, AND SILICA-BASED FILM

Japanese Patent Applications Nos. 2003-333885, 2003-333886 and 2003-333887, all filed on Sep. 25, 2003, are hereby incorporated by reference in their entirety.

BACKGROUND OF THE INVENTION

The present invention relates to a film forming composition, a process for producing a film forming composition, an insulating film forming material, a process for forming a film, and a silica-based film. More particularly, the present invention relates to a process for producing a film forming composition which can form a film having a low relative dielectric constant and exhibiting excellent chemical resistance, adhesion, and insulating properties, a film forming composition, an insulating film forming material, a process for forming a film, and a silica-based film.

Conventionally, a silica ($SiO_2$) film formed by a vacuum process such as a CVD process has been widely used as an interlayer dielectric in a semiconductor device or the like. In recent years, a spin on glass (SOG) film which is a coating type insulating film containing a tetraalkoxysilane hydrolyzate as a major component has been used in order to form a more uniform interlayer dielectric. Accompanied by an increase in the degree of integration of a semiconductor device or the like, a low-relative-dielectric-constant interlayer dielectric called an organic SOG containing organopolysiloxane as a major component has been developed.

However, since an increase in the degree of integration of a semiconductor device or the like has further progressed, further excellent electrical insulation between conductors has been demanded. Therefore, an interlayer dielectric material having a lower relative dielectric constant has been in demand.

To deal with this demand, coating type insulating film forming compositions having a lower relative dielectric constant have been disclosed as interlayer dielectric materials (see Japanese Patent Application Laid-open No. 6-181201, Japanese Patent Application Laid-open No. 2000-256621, and Japanese Patent Application Laid-open No. 2002-285086, for example). The coating type composition disclosed in Japanese Patent Application Laid-open No. 6-181201 aims at providing an insulating film for a semiconductor device having low hygroscopicity and excellent cracking resistance. This coating type insulating film forming composition contains, as a major component, an oligomer with a number average molecular weight of 500 or more which is obtained by polycondensation of an organometallic compound containing at least one element selected from titanium, zirconium, niobium, and tantalum and an organosilicon compound having at least one alkoxy group in the molecule.

The film forming compositions disclosed in Japanese Patent Application Laid-open No. 2000-256621 and Japanese Patent Application Laid-open No. 2002-285086 are obtained by hydrolyzing and condensing alkoxysilanes in the presence of a metal catalyst. The film forming composition disclosed in Japanese Patent Application Laid-open No. 2000-256621 has a low relative dielectric constant and a high modulus of elasticity and excels in cracking resistance and CMP resistance. The film forming composition disclosed in Japanese Patent Application Laid-open No. 2002-285086 has a low relative dielectric constant and low hygroscopicity, excels in film uniformity, and causes an increase in film thickness to only a small extent during long-term storage.

In the semiconductor device manufacturing process in recent years, a chemical mechanical polishing (CMP) step has been widely used in order to plarnarize a stacked film. Therefore, adhesion between the interlayer dielectric and the substrate is demanded for a semiconductor device so as to withstand the CMP step.

In the semiconductor device manufacturing process, a washing step is generally performed after performing etching and ashing steps. Chemicals such as hydrofluoric acid are used in the washing step. Chemicals such as hydrofluoric acid may be used as an etchant for wet etching. In the case of an insulating film formed by using a conventional film forming composition, the contact surface with the above chemical used in the washing step or the etching step is eroded, whereby insulating properties may be decreased. Even if the contact surface with the chemical is not eroded, the surface of the insulating film undergoes chemical changes and absorbs water, whereby the insulating properties may be decreased. Therefore, formation of an insulating film having adhesion and chemical resistance which can withstand the CMP step and having insulating properties is demanded.

BRIEF SUMMARY OF THE INVENTION

The present invention may provide a process for producing a film forming composition which can form a film having a low relative dielectric constant and exhibiting excellent chemical resistance, adhesion, and insulating properties.

The present invention may provide a film forming composition obtained by the above production process, an insulating film forming material comprising the film forming composition, a process for forming a film, and a silica-based film.

According to a first aspect of the present invention, there is provided a process for producing a film forming composition, the process comprising hydrolyzing and condensing:

(A) at least one silane compound selected from a compound (A-1) shown by the following general formula (1), a compound (A-2) shown by the following general formula (2), and a compound (A-3) shown by the following general formula (3),

$$R_aSi(OR^1)_{4-a} \tag{1}$$

wherein R represents a hydrogen atom, a fluorine atom, or a monovalent organic group, $R^1$ represents a monovalent organic group, and a represents 1 or 2;

$$Si(OR^2)_4 \tag{2}$$

wherein $R^2$ represents a monovalent organic group;

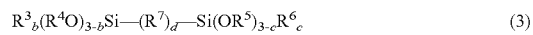
$$R^3{}_b(R^4O)_{3-b}Si-(R^7)_d-Si(OR^5)_{3-c}R^6{}_c \tag{3}$$

wherein $R^3$, $R^4$, $R^5$, and $R^6$ individually represent a monovalent organic group, b and c individually represent an integer of 0 to 2, $R^7$ represents an oxygen atom, a phenylene group, or a group $-(CH_2)_m-$ (wherein m represents an integer of 1 to 6), and d represents 0 or 1; and (B) a cyclic silane compound shown by the following general formula (4):

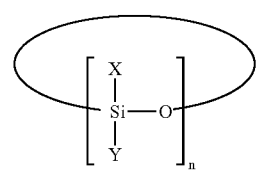

$$(4)$$

wherein X and Y individually represent a hydrogen atom or a monovalent organic group, and n represents an integer of 2 to 8.

(i) In this process, the hydrolysis and condensation may be carried out in the presence of (C-1) a metal chelate compound shown by the following general formula (5) or an acidic compound:

$$R^8{}_e M(OR^9)_{f-e} \tag{5}$$

wherein $R^8$ represents a chelating agent, M represents a metal atom, $R^9$ represents an alkyl group having 2 to 5 carbon atoms or an aryl group having 6 to 20 carbon atoms, f represents the valence of the metal M, and e represents an integer of 1 to f.

In this process, the amount of the component (B) may be 1 to 200 parts by weight for 100 parts by weight of the component (A) (converted into complete hydrolysis-condensation product).

In this process, the concentration of the component (A) and the component (B) at the time of the hydrolysis and condensation may be 1 to 30 wt % (converted into complete hydrolysis-condensation product).

In this process, the amount of the component (C-1) to be used may be 0.0001 to 10 parts by weight for 100 parts by weight of the total amount of the component (A) and the component (B) (converted into complete hydrolysis-condensation product) at the time of the hydrolysis and condensation.

In this process, the acidic compound used as the component (C-1) may be an organic acid.

In this process, the hydrolysis and condensation may be carried out in the presence of (D-1) water, and the amount of the water (D-1) to be used may be 0.5 to 10 mol for 1 mol of the total amount of the component (A) and the component (B).

(ii) In this process, the hydrolysis and condensation may be carried out in the presence of (C-2) a basic compound.

In this process, the amount of the component (B) may be 1 to 200 parts by weight for 100 parts by weight of the component (A) (converted into complete hydrolysis-condensation product).

In this process, the concentration of the component (A) and the component (B) at the time of the hydrolysis and condensation may be 0.1 to 10 wt % (converted into complete hydrolysis-condensation product).

In this process, the amount of the component (C-2) to be used may be 0.00001 to 1 mol for 1 mol of the total amount of alkoxy groups in the component (A) and the component (B) in total at the time of hydrolysis and condensation.

In this process, the hydrolysis and condensation may be carried out in the presence of (D-2) water and (E) an alcohol having a boiling point of 100° C. or less. In this case, the amount of the water (D-2) to be used may be 0.5 to 150 mol for 1 mol of the total amount of the component (A) and the component (B).

In (i) and (ii), the hydrolysis and condensation may be carried out in the presence of (F) an organic solvent shown by the following general formula (6):

$$R^{10}O(CHCH_3CH_2O)_g R^{11} \tag{6}$$

wherein $R^{10}$ and $R^{11}$ are individually a hydrogen atom, or a monovalent organic group selected from alkyl groups having 1 to 4 carbon atoms and $CH_3CO-$, and g is 1 or 2.

According to a second aspect of the present invention, there is provided a film forming composition obtained by the above-described process for producing a film forming composition. This film forming composition may further comprise at least one compound selected from compounds having a polyalkylene oxide structure, fluorine-containing surfactants, and silicone-containing surfactants.

According to a third aspect of the present invention, there is provided an insulating film forming material comprising the above-described film forming composition.

According to a fourth aspect of the present invention, there is provided a film forming composition comprising:

(I) a hydrolysis-condensation product obtained by hydrolyzing and condensing:

(A) at least one silane compound selected from a compound (A-1) shown by the following general formula (1), a compound (A-2) shown by the following general formula (2), and a compound (A-3) shown by the following general formula (3), $$R_a Si(OR^1)_{4-a} \tag{1}$$

wherein R represents a hydrogen atom, a fluorine atom, or a monovalent organic group, $R^1$ represents a monovalent organic group, and a represents 1 or 2, $$Si(OR^2)_4 \tag{2}$$

wherein $R^2$ represents a monovalent organic group;

$$R^3{}_b(R^4O)_{3-b}Si-(R^7)_d-Si(OR^5)_{3-c}R^6{}_c \tag{3}$$

wherein $R^3$, $R^4$, $R^5$, and $R^6$ individually represent a monovalent organic group, b and c individually represent an integer of 0 to 2, $R^7$ represents an oxygen atom, a phenylene group, or a group $-(CH_2)_m-$ (wherein m represents an integer of 1 to 6), and d represents 0 or 1; and (B) a cyclic silane compound shown by the following general formula (4),

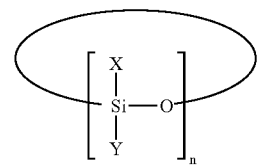

(4)

wherein X and Y individually represent a hydrogen atom or a monovalent organic group, and n represents an integer of 2 to 8;

(II) a compound which is compatible with or dispersed in the hydrolysis-condensation product (I) and has a boiling point or decomposition temperature of 200 to 400° C.; and (III) an organic solvent.

In this film forming composition, the hydrolysis and condensation may be carried out in the presence of an acidic compound, a basic compound, or a metal chelate compound.

In this film forming composition, the compound (II) may be a compound having a polyalkylene oxide structure or a (meth)acrylic polymer.

In this case, the polyalkylene oxide structure may be at least one structure selected from a polymethylene oxide structure, a polyethylene oxide structure, a polypropylene oxide structure, a polytetramethylene oxide structure, and polybutylene oxide structure.

Moreover, the (meth)acrylic polymer may be obtained by polymerizing a compound shown by the following general formula (7) and a compound shown by the following general formula (8):

$$CH_2=CR^{12}COOR^{13} \tag{7}$$

wherein $R^{12}$ represents a hydrogen atom or a methyl group, and $R^{13}$ represents a monovalent aliphatic hydrocarbon group;

$$CH_2=CR^{14}COOR^{15} \tag{8}$$

wherein $R^{14}$ represents a hydrogen atom or a methyl group, and $R^{15}$ represents a functional group including a heteroatom.

In this film forming composition, the organic solvent (III) may be an alkylene glycol solvent.

In this film forming composition, the amount of the compound (II) may be 5 to 200 parts by weight for 100 parts by weight of the hydrolysis-condensation product (I) (converted into complete hydrolysis-condensation product).

This film forming composition may further comprise a fluorine-containing surfactant and/or a silicone-containing surfactant (IV).

According to a fifth aspect of the present invention, there is provided a process for forming a film, comprising:

applying any of the above-described film forming compositions to a substrate to form a film; and subjecting the film to at least one type of processing selected from heating, electron beam irradiation, ultraviolet irradiation, and oxygen plasma processing.

According to a sixth aspect of the present invention, there is provided a process for forming a film, comprising:

applying any of the above-described film forming compositions to a substrate to form a film;

heating the film at a temperature less than the boiling point or decomposition temperature of the compound (II) to partially cure the film; and subjecting the film to at least one type of processing selected from heating, electron beam irradiation, ultraviolet irradiation, and oxygen plasma processing at a temperature equal to or higher than the boiling point or decomposition temperature of the compound (II) to completely cure the film.

According to a seventh aspect of the present invention, there is provide a silica-based film obtained by any of the above-described process for forming a film.

In the process for producing a film forming composition of the present invention, the component (B) is condensed with the component (A). The amount of organic components (carbon content) in the resulting film forming composition can be increased by using the component (B). Chemicals such as hydrofluoric acid generally have a function of cutting an Si—O—Si bond. Therefore, the Si—O—Si bond in the film can be reduced by increasing the amount of organic components (carbon content) in the resulting film forming composition by using the component (B). As a result, resistance to chemicals such as hydrofluoric acid can be increased. Moreover, mobility of the film can be increased by increasing the amount of organic components (carbon content) in the resulting film forming composition by using the component (B). As a result, since the external stress can be reduced, adhesion can be increased. A film forming composition exhibiting excellent insulating properties and chemical resistance while securing adhesion between the film and the application target can be obtained for the above-described reasons. Since the insulating film forming material of the present invention includes the above film forming composition, an insulating film having a low relative dielectric constant and exhibiting excellent insulating properties, adhesion, and chemical resistance can be formed by forming the insulating film using the insulating film forming material.

The film forming composition of the present invention includes the hydrolysis-condensation product (I), the compound (II), and the organic solvent (III). The hydrolysis-condensation product (I) is obtained by hydrolyzing the component (A) and the component (B). The amount of organic components (carbon content) in the resulting film forming composition can be increased by using the hydrolysis-condensation product (I) obtained by using the component (B). Chemicals such as fluoroboric acid generally have a function of cutting an Si—O—Si bond. Therefore, the Si—O—Si bond in the film can be reduced by increasing the amount of organic components (carbon content) in the resulting composition by obtaining the hydrolysis-condensation product (I) using the component (B). As a result, resistance to chemicals such as hydrofluoric acid can be increased. A film forming composition which can form a film having a low relative dielectric constant and exhibiting excellent chemical resistance can be obtained for the above-described reason.

The process for forming a film of the present invention can form a film having a low relative dielectric constant and exhibiting excellent chemical resistance by forming the film using the film forming composition.

Since the silica-based film of the present invention is obtained by the above process for forming a film, the silica-based film has a low relative dielectric constant and exhibits excellent chemical resistance.

DETAILED DESCRIPTION OF THE EMBODIMENTS

The film forming composition and process for producing the same, insulating film forming material, film formation process, and silica-based film of the present invention are described below in detail.

1. Film Forming Composition and Process for Producing the Film Forming Composition The film forming composition of the present invention includes (I) a hydrolysis-condensation product, (II) a compound, and (III) an organic solvent. The components (I) to (III) are individually described below.

1.1 Hydrolysis-Condensation Product (I)

The hydrolysis-condensation product (I) is obtained by hydrolysis and condensation of a component (A) and a component (B) described later. The hydrolysis and condensation can be performed in the presence of an acidic compound, a basic compound, or a metal chelate compound. In more detail, the hydrolysis and condensation can be performed in the presence of a component (C-1) or a component (C-2) described later.

The temperature when hydrolyzing the component (A) and the component (B) is usually 0 to 100° C., preferably 15 to 90° C., and still more preferably 15 to 80° C.

In the present invention, "hydrolysis" not only includes the case where all the alkoxy groups of the component (A) included in the reaction system are hydrolyzed, but also includes the case where only one alkoxy group is hydrolyzed or the case where two or more alkoxy groups are hydrolyzed, and further includes the case where a part or all of the Si—O bonds of the component (B) are hydrolyzed. In the present invention, "condensation" refers to the case where the silanol groups of the component (A) are condensed, or the case where the silanol group of the component (A) and the silanol group of the component (B) are condensed to form an Si—O—Si bond. All the silanol groups included in the component (A) and the component (B) are not necessarily condensed. The "condensation" is the concept which includes the case where a part of the silanol groups is condensed.

In the present invention, the complete hydrolysis-condensation product in the component (A) means a product in which the alkoxy group bonded to Si in the component (A) is hydrolyzed to form an SiOH group at a percentage of 100% and is completely condensed to form a siloxane structure. The complete hydrolysis-condensation product in the component (B) means a product in which the Si—O bond in the component (B) is hydrolyzed to form an SiOH group and is completely condensed to form a siloxane structure. The complete hydrolysis-condensation product of the hydrolysis-condensation product (I) means that each of the potions originating from the component (A) and the component (B) has the above siloxane structure.

The component (A) is preferably hydrolysis-condensation products of the compound (A-1) and the compound (A-2) since the resulting composition exhibits excellent storage stability.

Each substance used for the process for producing the film forming composition of the present invention is described below.

1.1.1 Component (A)

The component (A) is at least one silane compound selected from a compound (A-1) shown by the following general formula (1), a compound (A-2) shown by the following general formula (2), and a compound (A-3) shown by the following general formula (3), $$R_a Si(OR^1)_{4-a} \qquad (1)$$

wherein R represents a hydrogen atom, a fluorine atom, or a monovalent organic group, $R^1$ represents a monovalent organic group, and a represents 1 or 2;

$$Si(OR_2)_4 \qquad (2)$$

wherein $R^2$ represents a monovalent organic group;

$$R^3{}_b(R^4O)_{3-b}Si\text{---}(R^7)_d\text{---}Si(OR^5)_{3-c}R^6{}_c \qquad (3)$$

wherein $R^3$, $R^4$, $R^5$, and $R^6$ individually represent a monovalent organic group, b and c individually represent an integer of 0 to 2, $R^7$ represents an oxygen atom, a phenylene group, or a group —$(CH_2)_m$— (wherein m represents an integer of 1 to 6), and d represents 0 or 1.

Each of the compounds (A-1) to (A-3) is described below.

Compound (A-1); As a monovalent organic group represented by R or $R^1$ in the formula (1), an alkyl group, aryl group, allyl group, glycidyl group, and the like can be given. In the formula (1), R is preferably a monovalent organic group, particularly an alkyl group or an aryl group. As examples of the alkyl group, a methyl group, ethyl group, propyl group, butyl group, and the like can be given. The alkyl group preferably has 1 to 5 carbon atoms. These alkyl group may be either linear or branched, and the hydrogen atom in the alkyl group may be replaced by a fluorine atom or the like. In the formula (1), as examples of the aryl group, a phenyl group, naphthyl group, methylphenyl group, ethyl phenyl group, chlorophenyl group, bromophenyl group, fluorophenyl group, and the like can be given.

Examples of compounds preferable as the compound (A-1) include: trimethoxysilane, triethoxysilane, tri-n-propoxysilane, tri-iso-propoxysilane, tri-n-butoxysilane, tri-sec-butoxysilane, tri-tert-butoxysilane, triphenoxysilane, fluorotrimethoxysilane, fluorotriethoxysilane, fluorotri-n-propoxysilane, fluorotri-iso-propoxysilane, fluorotri-n-butoxysilane, fluorotri-sec-butoxysilane, fluorotri-tert-butoxysilane, fluorotriphenoxysilane, methyltrimethoxysilane, methyltriethoxysilane, methyltri-n-propoxysilane, methyltri-iso-propoxysilane, methyltri-n-butoxysilane, methyltri-sec-butoxysilane, methyltri-tert-butoxysilane, methyltriphenoxysilane, ethyltrimethoxysilane, ethyltriethoxysilane, ethyltri-n-propoxysilane, ethyltri-iso-propoxysilane, ethyltri-n-butoxysilane, ethyltri-sec-butoxysilane, ethyltri-tert-butoxysilane, ethyltriphenoxysilane, vinyltrimethoxysilane, vinyltriethoxysilane, vinyltri-n-propoxysilane, vinyltri-iso-propoxysilane, vinyltri-n-butoxysilane, vinyltri-sec-butoxysilane, vinyltri-tert-butoxysilane, vinyltriphenoxysilane, n-propyltrimethoxysilane, n-propyltriethoxysilane, n-propyltri-n-propoxysilane, n-propyltri-iso-propoxysilane, n-propyltri-n-butoxysilane, n-propyltri-sec-butoxysilane, n-propyltri-tert-butoxysilane, n-propyltriphenoxysilane, i-propyltrimethoxysilane, i-propyltriethoxysilane, i-propyltri-n-propoxysilane, i-propyltri-iso-propoxysilane, i-propyltri-n-butoxysilane, i-propyltri-sec-butoxysilane, i-propyltri-tert-butoxysilane, i-propyltriphenoxysilane, n-butyltrimethoxysilane, n-butyltriethoxysilane, n-butyltri-n-propoxysilane, n-butyltri-iso-propoxysilane, n-butyltri-n-butoxysilane, n-butyltri-sec-butoxysilane, n-butyltri-tert-butoxysilane, n-butyltriphenoxysilane, sec-butyltrimethoxysilane, sec-butyltriethoxysilane, sec-butyl-tri-n-propoxysilane, sec-butyl-tri-iso-propoxysilane, sec-butyl-tri-n-butoxysilane, sec-butyl-tri-sec-butoxysilane, sec-butyl-tri-tert-butoxysilane, sec-butyl-triphenoxysilane, t-butyltrimethoxysilane, t-butyltriethoxysilane, t-butyltri-n-propoxysilane, t-butyltri-iso-propoxysilane, t-butyltri-n-butoxysilane, t-butyltri-sec-butoxysilane, t-butyltri-tert-butoxysilane, t-butyltriphenoxysilane, phenyltrimethoxysilane, phenyltriethoxysilane, phenyltri-n-propoxysilane, phenyltri-iso-propoxysilane, phenyltri-n-butoxysilane, phenyltri-sec-butoxysilane, phenyltri-tert-butoxysilane, phenyltriphenoxysilane, γ-aminopropyltrimethoxysilane, γ-aminopropyltriethoxysilane, γ-glycidoxypropyltrimethoxysilane, γ-glycidoxypropyltriethoxysilane, γ-trifluoropropyltrimethoxysilane, γ-trifluoropropyltriethoxysilane; dimethyldimethoxysilane, dimethyldiethoxysilane, dimethyl-di-n-propoxysilane, dimethyl-di-iso-propoxysilane, dimethyl-di-n-butoxysilane, dimethyl-di-sec-butoxysilane, dimethyl-di-tert-butoxysilane, dimethyldiphenoxysilane, diethyldimethoxysilane, diethyldiethoxysilane, diethyl-di-n-propoxysilane, diethyl-di-iso-propoxysilane, diethyl-di-n-butoxysilane, diethyl-di-sec-butoxysilane, diethyl-di-tert-butoxysilane, diethyldiphenoxysilane, di-n-propyldimethoxysilane, di-n-propyldiethoxysilane, di-n-propyl-di-n-propoxysilane, di-n-propyl-di-iso-propoxysilane, di-n-propyl-di-n-butoxysilane, di-n-propyl-di-sec-butoxysilane, di-n-propyl-di-tert-butoxysilane, di-n-propyl-di-phenoxysilane, di-iso-propyldimethoxysilane, di-iso-propyldiethoxysilane, di-iso-propyl-di-n-propoxysilane, di-iso-propyl-di-iso-propoxysilane, di-iso-propyl-di-n-butoxysilane, di-iso-propyl-di-sec-butoxysilane, di-iso-propyl-di-tert-butoxysilane, di-iso-propyl-di-phenoxysilane, di-n-butyldimethoxysilane, di-n-butyldiethoxysilane, di-n-butyl-di-n-propoxysilane, di-n-butyl-di-iso-propoxysilane, di-n-butyl-di-n-butoxysilane, di-n-butyl-di-sec-butoxysilane, di-n-butyl-di-tert-butoxysilane, di-n-butyl-di-phenoxysilane, di-sec-butyldimethoxysilane, di-sec-butyldiethoxysilane, di-sec-butyl-di-n-propoxysilane, di-sec-butyl-di-iso-propoxysilane, di-sec-butyl-di-n-butoxysilane, di-sec-butyl-di-sec-butoxysilane, di-sec-butyl-di-tert-butoxysilane, di-sec-butyl-di-phenoxysilane, di-tert-butyldimethoxysilane, di-tert-butyldiethoxysilane, di-tert-butyl-di-n-propoxysilane, di-tert-butyl-di-iso-propoxysilane, di-tert-butyl-di-n-butoxysilane, di-tert-butyl-di-sec-butoxysilane, di-tert-butyl-di-tert-butoxysilane, di-tert-butyl-di-phenoxysilane, diphenyldimethoxysilane, diphenyl-di-ethoxysilane, diphenyl-di-n-propoxysilane, diphenyl-di-iso-propoxysilane, diphenyl-di-n-butoxysilane, diphenyl-di-sec-butoxysilane, diphenyl-di-tert-butoxysilane, diphenyldiphenoxysilane, divinyldimethoxysilane, di-γ-aminopropyldimethoxysilane, di-γ-glycidoxypropyldimethoxysilane, di-γ-trifluoropropyldimethoxysilane; and the like.

Of these compounds, methyltrimethoxysilane, methyltriethoxysilane, methyltri-n-propoxysilane, methyltri-iso-propoxysilane, ethyltrimethoxysilane, ethyltriethoxysilane, vinyltrimethoxysilane, vinyltriethoxysilane, phenyltrimethoxysilane, phenyltriethoxysilane, dimethyldimethoxysilane, dimethyldiethoxysilane, diethyldimethoxysilane, diethyldiethoxysilane, diphenyldimethoxysilane, and diphenyldiethoxysilane are preferable. Methyltrimethoxysilane, methyltriethoxysilane, ethyltrimethoxysilane, vinyltrimethoxysilane, phenyltrimethoxysilane, dimethyldimethoxysilane, and dimethyldiethoxysilane are particularly preferable. These compounds may be used either individually or in combination of two or more.

Compound (A-2); In the formula (2), as examples of a monovalent organic group represented by $R^2$, the organic groups given as examples for the formula (1) can be given. As specific examples of the compound (A-2), tetramethoxysilane, tetraethoxysilane, tetra-n-propoxysilane, tetra-iso-propoxysilane, tetra-n-butoxysilane, tetra-sec-butoxysilane, tetra-tert-butoxysilane, tetraphenoxysilane, and the like can be given. Of these compounds, tetramethoxysilane, tetraethoxysilane, tetra-n-propoxysilane, tetra-iso-propoxysilane, and tetraphenoxysilane are preferable. Tetramethoxysilane and tetraethoxysilane are particularly preferable. These compounds may be used either individually or in combination of two or more.

Compound (A-3); In the formula (3), as examples of monovalent organic groups represented by $R^3$ to $R^6$, the organic groups given as examples for the formula (1) can be given. As examples of the compounds (A-3) in which $R^7$ in the formula (3) is an oxygen atom, hexamethoxydisiloxane, hexaethoxydisiloxane, hexaphenoxydisiloxane, 1,1,1,3,3-pentamethoxy-3-methyldisiloxane, 1,1,1,3,3-pentaethoxy-3-methyldisiloxane, 1,1,1,3,3-pentaphenoxy-3-methyldisiloxane, 1,1,1,3,3-pentamethoxy-3-ethyldisiloxane, 1,1,1,3,3-pentaethoxy-3-ethyldisiloxane, 1,1,1,3,3-pentaphenoxy-3-ethyldisiloxane, 1,1,1,3,3-pentamethoxy-3-phenyldisiloxane, 1,1,1,3,3-pentaethoxy-3-phenyldisiloxane, 1,1,1,3,3-pentaphenoxy-3-phenyldisiloxane, 1,1,3,3-tetramethoxy-1,3-dimethyldisiloxane, 1,1,3,3-tetraethoxy-1,3-dimethyldisiloxane, 1,1,3,3-tetraphenoxy-1,3-dimethyldisiloxane, 1,1,3,3-tetramethoxy-1,3-diethyldisiloxane, 1,1,3,3-tetraethoxy-1,3-diethyldisiloxane, 1,1,3,3-tetraphenoxy-1,3-diethyldisiloxane, 1,1,3,3-tetramethoxy-1,3-diphenyldisiloxane, 1,1,3,3-tetraethoxy-1,3-diphenyldisiloxane, 1,1,3,3-tetraphenoxy-1,3-diphenyldisiloxane, 1,1,3-trimethoxy-1,3,3-trimethyldisiloxane, 1,1,3-triethoxy-1,3,3-trimethyldisiloxane, 1,1,3-triphenoxy-1,3,3-trimethyldisiloxane, 1,1,3-trimethoxy-1,3,3-triethyldisiloxane, 1,1,3-triethoxy-1,3,3-triethyldisiloxane, 1,1,3-triphenoxy-1,3,3-triethyldisiloxane, 1,1,3-trimethoxy-1,3,3-triphenyldisiloxane, 1,1,3-triethoxy-1,3,3-triphenyldisiloxane, 1,1,3-triphenoxy-1,3,3-triphenyldisiloxane, 1,3-dimethoxy-1,1,3,3-tetramethyldisiloxane, 1,3-diethoxy-1,1,3,3-tetramethyldisiloxane, 1,3-diphenoxy-1,1,3,3-tetramethyldisiloxane, 1,3-dimethoxy-1,1,3,3-tetraethyldisiloxane, 1,3-diethoxy-1,1,3,3-tetraethyldisiloxane, 1,3-diphenoxy-1,1,3,3-tetraethyldisiloxane, 1,3-dimethoxy-1,1,3,3-tetraphenyldisiloxane, 1,3-diethoxy-1,1,3,3-tetraphenyldisiloxane, 1,3-diphenoxy-1,1,3,3-tetraphenyldisiloxane, and the like can be given.

Of these compounds, hexamethoxydisiloxane, hexaethoxydisiloxane, 1,1,3,3-tetramethoxy-1,3-dimethyldisiloxane, 1,1,3,3-tetraethoxy-1,3-dimethyldisiloxane, 1,1,3,3-tetramethoxy-1,3-diphenyldisiloxane, 1,3-dimethoxy-1,1,3,3-tetramethyldisiloxane, 1,3-dimethoxy-1,1,3,3-tetraethyldisiloxane, 1,3-dimethoxy-1,1,3,3-tetraphenyldisiloxane, 1,3-diethoxy-1,1,3,3-tetraphenyldisiloxane, and the like are preferable.

As examples of the compounds in which d=0 in the formula (3), hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentaphenoxy-2-methyldisilane, 1,1,1,2,2-pentamethoxy-2-ethyldisilane, 1,1,1,2,2-pentaethoxy-2-ethyldisilane, 1,1,1,2,2-pentaphenoxy-2-ethyldisilane, 1,1,1,2,2-pentamethoxy-2-phenyldisilane, 1,1,1,2,2-pentaethoxy-2-phenyldisilane, 1,1,1,2,2-pentaphenoxy-2-phenyldisilane, 1,1,2,2-tetramethoxy-1,2-dimethyldisilane, 1,1,2,2-tetraethoxy-1,2-dimethyldisilane, 1,1,2,2-tetraphenoxy-1,2-dimethyldisilane, 1,1,2,2-tetramethoxy-1,2-diethyldisilane, 1,1,2,2-tetraethoxy-1,2-diethyldisilane, 1,1,2,2-tetraphenoxy-1,2-diethyldisilane, 1,1,2,2-tetramethoxy-1,2-diphenyldisilane, 1,1,2,2-tetraethoxy-1,2-diphenyldisilane, 1,1,2,2-tetraphenoxy-1,2-diphenyldisilane, 1,1,2-trimethoxy-1,2,2-trimethyldisilane, 1,1,2-triethoxy-1,2,2-trimethyldisilane, 1,1,2-triphenoxy-1,2,2-trimethyldisilane, 1,1,2-trimethoxy-1,2,2-triethyldisilane, 1,1,2-triethoxy-1,2,2-triethyldisilane, 1,1,2-triphenoxy-1,2,2-triethyldisilane, 1,1,2-trimethoxy-1,2,2-triphenyldisilane, 1,1,2-triethoxy-1,2,2-triphenyldisilane, 1,1,2-triphenoxy-1,2,2-triphenyldisilane, 1,2-dimethoxy-1,1,2,2-tetramethyldisilane, 1,2-diethoxy-1,1,2,2-tetramethyldisilane, 1,2-diphenoxy-1,1,2,2-tetramethyldisilane, 1,2-dimethoxy-1,1,2,2-tetraethyldisilane, 1,2-diethoxy-1,1,2,2-tetraethyldisilane, 1,2-diphenoxy-1,1,2,2-tetraethyldisilane, 1,2-dimethoxy-1,1,2,2-tetraphenyldisilane, 1,2-diethoxy-1,1,2,2-tetraphenyldisilane, 1,2-diphenoxy-1,1,2,2-tetraphenyldisilane, and the like can be given.

Of these compounds, hexamethoxydisilane, hexaethoxydisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, 1,2-diethoxy-1,1,2,2-tetraphenyldisilane, and the like are preferable.

As examples of the compounds in which $R^7$ is the group —$(CH_2)_m$— in the formula (A-3), bis(trimethoxysilyl)methane, bis(triethoxysilyl)methane, bis(tri-n-propoxysilyl)methane, bis(tri-i-propoxysilyl)methane, bis(tri-n-butoxysilyl)methane, bis(tri-sec-butoxysilyl)methane, bis(tri-t-butoxysilyl)methane, 1,2-bis(trimethoxysilyl)ethane, 1,2-bis(triethoxysilyl)ethane, 1,2-bis(tri-n-propoxysilyl)ethane, 1,2-bis(tri-i-propoxysilyl)ethane, 1,2-bis(tri-n-butoxysilyl)ethane, 1,2-bis(tri-sec-butoxysilyl)ethane, 1,2-bis(tri-t-butoxysilyl)ethane, 1-(dimethoxymethylsilyl)-1-(trimethoxysilyl)methane, 1-(diethoxymethylsilyl)-1-(triethoxysilyl)methane, 1-(di-n-propoxymethylsilyl)-1-(tri-n-propoxysilyl)methane, 1-(di-i-propoxymethylsilyl)-1-(tri-i-propoxysilyl)methane, 1-(di-n-butoxymethylsilyl)-1-(tri-n-butoxysilyl)methane, 1-(di-sec-butoxymethylsilyl)-1-(tri-sec-butoxysilyl)methane, 1-(di-t-butoxymethylsilyl)-1-(tri-t-butoxysilyl)methane, 1-(dimethoxymethylsilyl)-2-(trimethoxysilyl)ethane, 1-(diethoxymethylsilyl)-2-(triethoxysilyl)ethane, 1-(di-n-propoxymethylsilyl)-2-(tri-n-propoxysilyl)ethane, 1-(di-i-propoxymethylsilyl)-2-(tri-i-propoxysilyl)ethane, 1-(di-n-butoxymethylsilyl)-2-(tri-n-butoxysilyl)ethane, 1-(di-sec-butoxymethylsilyl)-2-(tri-sec-butoxysilyl)ethane, 1-(di-t-butoxymethylsilyl)-2-(tri-t-butoxysilyl)ethane, bis(dimethoxymethylsilyl)methane, bis(diethoxymethylsilyl)methane, bis(di-n-propoxymethylsilyl)methane, bis(di-i-propoxymethylsilyl)methane, bis(di-n-butoxymethylsilyl)methane, bis(di-sec-butoxymethylsilyl)methane, bis(di-t-butoxymethylsilyl)methane, 1,2-bis(dimethoxymethylsilyl)ethane, 1,2-bis (diethoxymethylsilyl)ethane, 1,2-bis(di-n-propoxymethylsilyl)ethane, 1,2-bis(di-i-propoxymethylsilyl)ethane, 1,2-bis(di-n-butoxymethylsilyl) ethane, 1,2-bis(di-sec-butoxymethylsilyl)ethane, 1,2-bis(di-t-butoxymethylsilyl)ethane, and the like can be given. Of these compounds, bis(trimethoxysilyl)methane, bis(triethoxysilyl)methane, 1,2-bis(trimethoxysilyl)ethane, 1,2-bis(triethoxysilyl)ethane, 1-(dimethoxymethylsilyl)-1-(trimethoxysilyl)methane, 1-(diethoxymethylsilyl)-1-(triethoxysilyl)methane, 1-(dimethoxymethylsilyl)-2-(trimethoxysilyl)ethane, 1-(diethoxymethylsilyl)-2-(triethoxysilyl)ethane, bis(dimethoxymethylsilyl)methane, bis(diethoxymethylsilyl)methane, 1,2-bis(dimethoxymethylsilyl)ethane, 1,2-bis(diethoxymethylsilyl)ethane, and the like are preferable.

As examples of the compounds in which $R^7$ is a phenylene group in the formula (A-3), 1,2-bis(trimethoxysilyl)benzene, 1,2-bis(triethoxysilyl)benzene, 1,2-bis(tri-n-propoxysilyl)benzene, 1,2-bis(tri-iso-propoxysilyl)benzene, 1,2-bis(tri-n-butoxysilyl)benzene, 1,2-bis(tri-sec-butoxysilyl)benzene, 1,2-bis(tri-tert-butoxysilyl)benzene, 1,3-bis(trimethoxysilyl)benzene, 1,3-bis(triethoxysilyl)benzene, 1,3-bis(tri-n-propoxysilyl)benzene, 1,3-bis(tri-iso-propoxysilyl)benzene, 1,3-bis(tri-n-butoxysilyl)benzene, 1,3-bis(tri-sec-butoxysilyl)benzene, 1,3-bis(tri-tert-butoxysilyl)benzene, 1,4-bis(trimethoxysilyl)benzene, 1,4-bis(triethoxysilyl)benzene, 1,4-bis(tri-n-propoxysilyl)benzene, 1,4-bis(tri-iso-propoxysilyl)benzene, 1,4-bis(tri-n-butoxysilyl)benzene, 1,4-bis(tri-sec-butoxysilyl)benzene, 1,4-bis(tri-tert-butoxysilyl)benzene, and the like can be given.

Of these compounds, 1,2-bis(trimethoxysilyl)benzene, 1,2-bis(triethoxysilyl)benzene, 1,3-bis(trimethoxysilyl)benzene, 1,3-bis(triethoxysilyl)benzene, 1,4-bis(trimethoxysilyl)benzene, 1,4-bis(triethoxysilyl)benzene, and the like are preferable.

In the present invention, at least one of the compound (A-1), the compound (A-2), and the compound (A-3) is used as the component (A), and each of the compounds (A-1) to (A-3) may be used in combination of two or more.

1.1.2 Component (B)

The component (B) is a cyclic silane compound shown by the following general formula (4):

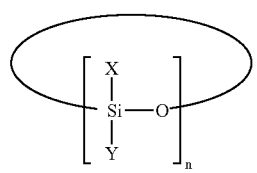

(4)

wherein X and Y individually represent a hydrogen atom or a monovalent organic group, and n represents an integer of 2 to 8.

In the formula (4), as examples of monovalent organic groups represented by X and Y, the organic groups given as examples for the formula (1) can be given. In the present invention, it is particularly preferable that both the groups represented by X and Y be alkyl groups.

As specific examples of the component (B), 1,3,5-trimethylcyclotrisiloxane, 1,3,5-triethylcyclotrisiloxane, 1,3,5-trivinylcyclotrisiloxane, 1,3,5-triphenylcyclotrisiloxane, hexamethylcyclotrisiloxane, hexaethylcyclotrisiloxane, hexavinylcyclotrisiloxane, hexaphenylcyclotrisiloxane, 1,3,5-trivinyl-1,3,5-trimethylcyclotrisiloxane, 1,3,5-trimethyl-1,3,5-triphenylcyclotrisiloxane, 1,3,5-tris(3,3,3-trifluoropropyl)-1,3,5-trimethylcyclotrisiloxane, 1,3,5,7-tetramethylcyclotetrasiloxane, 1,3,5,7-tetraethylcyclotetrasiloxane, 1,3,5,7-tetravinylcyclotetrasiloxane, 1,3,5,7-tetraphenylcyclotetrasiloxane, octamethylcyclotetrasiloxane, octaethylcyclotetrasiloxane, octavinylcyclotetrasiloxane, octaphenylcyclotetrasiloxane, 1,3,5,7-tetravinyl-1,3,5,7-tetramethylcyclotetrasiloxane, 1,3,5,7-tetramethyl-1,3,5,7-tetraphenylcyclotetrasiloxane, 1,3,5,7-tetrakis(3,3,3-trifluoropropyl)-1,3,5,7-tetramethylcyclotetrasiloxane, 1,3,5,7,9-pentamethylcyclopentasiloxane, 1,3,5,7,9-pentaethylcyclopentasiloxane, 1,3,5,7,9-pentavinylcyclopentasiloxane, 1,3,5,7,9-pentaphenylcyclopentasiloxane, decamethylcyclopentasiloxane, decaphenylcyclopentasiloxane, 1,3,5,7,9-pentavinyl-1,3,5,7,9-pentamethylcyclopentasiloxane, 1,3,5,7,9-pentamethyl-1,3,5,7,9-pentaphenylcyclopentasiloxane, 1,3,5,7,9,11-hexamethylcyclohexasiloxane, 1,3,5,7,9,11-hexavinylcyclohexasiloxane, 1,3,5,7,9,11-hexaphenylcyclohexasiloxane, dodecamethylcyclohexasiloxane, dodecavinylcyclohexasiloxane, dodecaphenylcyclohexasiloxane, and the like can be given. These compounds may be used either individually or in combination of two or more.

The amount of the component (B) to be used is preferably 1 to 200 parts by weight, and still more preferably 5 to 100 parts by weight for 100 parts by weight of the component (A) (converted into complete hydrolysis-condensation product). If the amount of the component (B) to be used is less than 1 part by weight for 100 parts by weight of the component (A) (converted into complete hydrolysis-condensation product), sufficient chemical resistance cannot be obtained. If the amount exceeds 200 parts by weight, applicability deteriorates at the time of application, whereby it becomes difficult to maintain CD uniformity of the applied film. The amount of the component (A) is the amount when converted into the complete hydrolysis-condensation product.

1.1.3 Component (C-1)

In the present invention, a component (C-1) (metal chelate compound or acidic compound) may be used as a catalyst when hydrolyzing and condensing the component (A) and the component (B). The metal chelate compound and the acidic compound (acid catalyst) used as the component (C-1) are described below.

When hydrolyzing and condensing the component (A) and the component (B) in the presence of the component (C-1), the concentration of the component (A) and the component (B) at the time of hydrolysis and condensation is preferably 0.1 to 30 wt %, more preferably 0.1 to 10 wt %, and still preferably 1 to 8 wt %. If the concentration is less than 0.1 wt %, the condensation reaction may not sufficiently proceed, whereby a coating liquid may not obtained. If the concentration is exceeds 30 wt %, precipitation or gelling of polymers may occur during the reaction. The concentration of the component (A) and the component (B) is the concentration when the component (A) and the component (B) are converted into the complete hydrolysis-condensation product.

1.1.4 Metal Chelate Compound

The metal chelate compound used as the component (C-1) is shown by the following general formula (5).

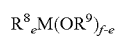 (5)

wherein $R^8$ represents a chelating agent, M represents a metal atom, R9 represents an alkyl group having 2 to 5 carbon atoms or an aryl group having 6 to 20 carbon atoms, f represents the valence of the metal M, and e represents an integer of 1 to f.

As the metal M, at least one metal selected from the group IIIB metals (aluminum, gallium, indium, and thallium) and the group IVA metals (titanium, zirconium, and hafnium) is preferable, and titanium, aluminum, and zirconium are still more preferable.

Specific examples of the metal chelate compound used as the component (C-1) include at least one of: titanium chelate compounds such as triethoxy•mono(acetylacetonate)titanium, tri-n-propoxy•mono(acetylacetonate)titanium, tri-i-propoxy•mono(acetylacetonate)titanium, tri-n-butoxy•mono(acetylacetonate)titanium, tri-sec-butoxy•mono(acetylacetonate)titanium, tri-t-butoxy•mono(acetylacetonate)titanium, diethoxy•bis(acetylacetonate)titanium, di-n-propoxy•bis(acetylacetonate)titanium, di-i-propoxy•bis(acetylacetonate)titanium, di-n-butoxy-bis(acetylacetonate)titanium, di-sec-butoxy•bis(acetylacetonate)titanium, di-t-butoxy•bis(acetylacetonate)titanium, monoethoxy•tris(acetylacetonate)titanium, mono-n-propoxy•tris(acetylacetonate)titanium, mono-i-propoxy•tris(acetylacetonate)titanium, mono-n-butoxy•tris(acetylacetonate)titanium, mono-sec-butoxy•tris(acetylacetonate)titanium, mono-t-butoxy•tris(acetylacetonate)titanium, tetrakis(acetylacetonate)titanium, triethoxy•mono(ethylacetoacetate)titanium, tri-n-propoxy•mono(ethylacetoacetate)titanium, tri-i-propoxy•mono(ethylacetoacetate)titanium, tri-n-butoxy•mono(ethylacetoacetate)titanium, tri-sec-butoxy•mono(ethylacetoacetate)titanium, tri-t-butoxy•mono(ethylacetoacetate)titanium, diethoxy•bis(ethylacetoacetate)titanium, di-n-propoxy•bis(ethylacetoacetate)titanium, di-i-propoxy•bis(ethylacetoacetate)titanium, di-n-butoxy•bis(ethylacetoacetate)titanium, di-sec-butoxy•bis(ethylacetoacetate)titanium, di-t-butoxy•bis(ethylacetoacetate)titanium, monoethoxy•tris(ethylacetoacetate)titanium, mono-n-propoxy•tris(ethylacetoacetate)titanium, mono-i-propoxy•tris(ethylacetoacetate)titanium, mono-n-butoxy•tris(ethylacetoacetate)titanium, mono-sec-butoxy•tris(ethylacetoacetate)titanium, mono-t-butoxy•tris(ethylacetoacetate)titanium, tetrakis(ethylacetoacetate)titanium, mono(acetylacetonate)tris(ethylacetoacetate)titanium, bis(acetylacetonate)bis(ethylacetoacetate)titanium, and tris(acetylacetonate)mono(ethylacetoacetate)titanium; zirconium chelate compounds such as triethoxy•mono(acetylacetonate)zirconium, tri-n-propoxy•mono(acetyl acetonate)zirconium, tri-i-propoxy•mono(acetylacetonate)zirconium, tri-n-butoxy•mono(acetylacetonate)zirconium, tri-sec-butoxy•mono(acetylacetonate)zirconium, tri-t-butoxy•mono(acetylacetonate)zirconium, diethoxy•bis(acetylacetonate)zirconium, di-n-propoxy•bis(acetylacetonate)zirconium, di-i-propoxy bis(acetylacetonate)zirconium, di-n-butoxy•bis(acetylacetonate)zirconium, di-sec-butoxy bis(acetylacetonate)zirconium, di-t-butoxy•bis(acetylacetonate)zirconium, monoethoxy•tris(acetylacetonate)zirconium, mono-n-propoxy•tris(acetylacetonate)zirconium, mono-i-propoxy•tris(acetylacetonate)zirconium, mono-n-butoxy•tris(acetylacetonate)zirconium, mono-sec-butoxy•tris(acetylacetonate)zirconium, mono-t-butoxy•tris(acetylacetonate)zirconium, tetrakis(acetylacetonate)zirconium, triethoxy•mono(ethylacetoacetate)zirconium, tri-n-propoxy•mono(ethylacetoacetate)zirconium, tri-i-propoxy•mono(ethylacetoacetate)zirconium, tri-n-butoxy•mono(ethylacetoacetate)zirconium, tri-sec-butoxy•mono(ethylacetoacetate)zirconium, tri-t-butoxy•mono(ethylacetoacetate)zirconium, diethoxy-bis(ethylacetoacetate)zirconium, di-n-propoxy•bis(ethylacetoacetate)zirconium, di-i-propoxy•bis(ethylacetoacetate)zirconium, di-n-butoxy•bis(ethylacetoacetate)zirconium, di-sec-butoxy•bis(ethylacetoacetate)zirconium, di-t-butoxy•bis(ethylacetoacetate)zirconium, monoethoxy•tris(ethylacetoacetate)zirconium, mono-n-propoxy•tris(ethylacetoacetate)zirconium, mono-i-propoxy•tris(ethylacetoacetate)zirconium, mono-n-butoxy•tris(ethylacetoacetate)zirconium, mono-sec-butoxy•tris(ethylacetoacetate)zirconium, mono-t-butoxy•tris(ethylacetoacetate)zirconium, tetrakis(ethylacetoacetate)zirconium, mono(acetylacetonate)tris(ethylacetoacetate)zirconium, bis(acetylacetonate)bis(ethylacetoacetate)zirconium, and tris(acetylacetonate)mono(ethylacetoacetate)zirconium; and aluminum chelate compounds such as triethoxy•mono(acetylacetonate)aluminum, tri-n-propoxy•mono(acetylacetonate)aluminum, tri-i-propoxy•mono(acetylacetonate)aluminum, tri-n-butoxy•mono(acetylacetonate)aluminum, tri-sec-butoxy•mono(acetylacetonate)aluminum, tri-t-butoxy•mono(acetylacetonate)aluminum, diethoxy•bis(acetylacetonate)aluminum, di-n-propoxy•bis(acetylacetonate)aluminum, di-i-propoxy•bis(acetylacetonate)aluminum, di-n-butoxy•bis(acetylacetonate)aluminum, di-sec-butoxy•bis(acetylacetonate)aluminum, di-t-butoxy•bis(acetylacetonate)aluminum, monoethoxy•tris(acetylacetonate)aluminum, mono-n-propoxy•tris(acetylacetonate)aluminum, mono-i-propoxy•tris(acetylacetonate)aluminum, mono-n-butoxy•tris(acetylacetonate)aluminum, mono-sec-butoxy•tris(acetylacetonate)aluminum, mono-t-butoxy•tris(acetylacetonate)aluminum, tetrakis(acetylacetonate)aluminum, triethoxy•mono(ethylacetoacetate)aluminum, tri-n-propoxy•mono(ethylacetoacetate)aluminum, tri-i-propoxy•mono(ethylacetoacetate)aluminum, tri-n-butoxy•mono(ethylacetoacetate)aluminum, tri-sec-butoxy•mono(ethylacetoacetate)aluminum, tri-t-butoxy•mono(ethylacetoacetate)aluminum, diethoxy•bis(ethylacetoacetate)aluminum, di-n-propoxy•bis(ethylacetoacetate)aluminum, di-i-propoxy•bis(ethylacetoacetate)aluminum, di-n-butoxy•bis(ethylacetoacetate)aluminum, di-sec-butoxy•bis(ethylacetoacetate)aluminum, di-t-butoxy•bis(ethylacetoacetate)aluminum, monoethoxy•tris(ethylacetoacetate)aluminum, mono-n-propoxy•tris(ethylacetoacetate)aluminum, mono-i-propoxy•tris(ethylacetoacetate)aluminum, mono-n-butoxy•tris(ethylacetoacetate)aluminum, mono-sec-butoxy•tris(ethylacetoacetate)aluminum, mono-t-butoxy•tris(ethylacetoacetate)aluminum, tetrakis(ethylacetoacetate)aluminum, mono(acetylacetonate)tris(ethylacetoacetate)aluminum, bis(acetylacetonate)bis(ethylacetoacetate)aluminum, and tris(acetylacetonate)mono(ethylacetoacetate)aluminum.

As the metal chelate compound used as the component (C-1), at least one of $(CH_3(CH_3)HCO)_{4-t}Ti(CH_3COCH_2COCH_3)_t$, $(CH_3(CH_3)HCO)_{4-t}Ti(CH_3COCH_2COOC_2H_5)_t$, $(C_4H_9O)_{4-t}Ti(CH_3COCH_2COCH_3)_t$, $(C_4H_9O)_{4-t}Ti(CH_3COCH_2COOC_2H_5)_t$, $(C_2H_5(CH_3)CO)_{4-t}Ti(CH_3COCH_2COCH_3)_t$, $(C_2H_5(CH_3)CO)_{4-t}Ti(CH_3COCH_2COOC_2H_5)_t$, $(CH_3(CH_3)HCO)_{4-t}Zr(CH_3COCH_2COCH_3)_t$, $(CH_3(CH_3)HCO)_{4-t}Zr(CH_3COCH_2COOC_2H_5)_t$, $(C_4H_9O)_{4-t}Zr(CH_3COCH_2COCH_3)_t$, $(C_4H_9O)_{4-t}Zr$ $(CH_3COCH_2COOC_2H_5)_r$,
$(CH_3COCH_2COCH_3)_r$,
$(CH_3COCH_2COOC_2H_5)_r$,
$(CH_3COCH_2COCH_3)_r$,
$(CH_3COCH_2COOC_2H_5)_r$,
$(CH_3COCH_2COCH_3)_r$,
$(CH_3COCH_2COOC_2H_5)_r$,
$(CH_3COCH_2COCH_3)_r$,
$(CH_3COCH_2COOC_2H_5)_r$, and the like is preferable.

$(C_2H_5(CH_3)CO)_{4-r}Zr$
$(C_2H_5(CH_3)CO)_{4-r}Zr$
$(CH_3(CH_3)HCO)_{3-r}Al$
$(CH_3(CH_3)HCO)_{3-r}Al$
$(C_4H_9O)_{3-r}Al$
$(C_4H_9O)_{3-r}Al$
$(C_2H_5(CH_3)CO)_{3-r}Al$
$(C_2H_5(CH_3)CO)_{3-r}Al$

1.1.5 Acidic Compound

As the acidic compound (acid catalyst) used as the component (C-1), organic acids or inorganic acids can be given. As examples of organic acids, acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, tartaric acid, maleic anhydride, fumaric acid, itaconic acid, succinic acid, mesaconic acid, citraconic acid, malic acid, malonic acid, hydrolyzate of glutaric acid, hydrolyzate of maleic anhydride, hydrolyzate of phthalic anhydride, and the like can be given. As examples of inorganic acids, hydrochloric acid, nitric acid, sulfuric acid, hydrofluoric acid, phosphoric acid, and the like can be given. Of these acids, the organic acid is preferable since precipitation or gelling of polymers during hydrolysis and condensation reaction rarely occurs. Among the organic acids, a compound including a carboxyl group is more preferable. In particular, acetic acid, oxalic acid, maleic acid, formic acid, malonic acid, phthalic acid, fumaric acid, itaconic acid, succinic acid, mesaconic acid, citraconic acid, malic acid, malonic acid, glutaric acid, and a hydrolysate of maleic anhydride are preferable. These compounds may be used either individually or in combination of two or more.

The amount of the component (C-1) to be used is 0.0001 to 10 parts by weight, and preferably 0.001 to 5 parts by weight for 100 parts by weight of the total amount of the component (A) and the component (B) (converted into complete hydrolysis-condensation product) at the time of hydrolysis and condensation. If the amount of the component (C-1) is less than 0.0001 parts by weight, applicability of a film may be decreased. If the amount exceeds 10 parts by weight, cracking resistance of the resulting film may be decreased. The component (C-1) may be added in advance to an organic solvent (F) described later together with the component (A) and the component (B), or may be dissolved or dispersed in water when adding water.

1.1.6 Water (D-1)

In the present invention, (D-1) water may be added when dissolving the component (A) and the component (B) in the solvent and hydrolyzing and condensing the component (A) and the component (B) in the presence of the component (C-1) (metal chelate compound or acidic compound). When hydrolyzing and condensing the component (A) and the component (B), the water (D-1) is preferably used in an amount of 0.5 to 20 mol, still more preferably 0.5 to 10 mol, and particularly preferably 1 to 10 mol for 1 mol of the component (A) and the component (B) in total. If the amount of the water (D-1) to be added is less than 0.5 mol, cracking resistance of the coating may be decreased. If the amount exceeds 20 mol, precipitation or gelling of polymers may occur during the hydrolysis and condensation reaction. It is preferable that the water (D-1) be added intermittently or continuously. The temperature when hydrolyzing the component (A) and the component (B) is usually 0 to 100° C., and preferably 15 to 80° C.

1.1.7 Component (C-2)

In the present invention, a component (C-2) (basic compound) may be used as a catalyst when hydrolyzing and condensing the component (A) and the component (B). The basic compound used as the component (C-2) is described below.

When hydrolyzing and condensing the component (A) and the component (B) in the presence of the component (C-2), the concentration of the component (A) and the component (B) at the time of hydrolysis and condensation is preferably 0.1 to 10 wt %, and still preferably 1 to 8 wt %. If the concentration is less than 0.1 wt %, the condensation reaction may not sufficiently proceed, whereby a coating liquid nay not obtained. If the concentration is exceeds 30 wt %, precipitation or gelling of polymers may occur during the reaction. The concentration of the component (A) and the component (B) is the concentration when the component (A) and the component (B) are converted into the complete hydrolysis-condensation product. The reaction temperature is usually 0 to 100° C., and preferably 15 to 90° C.

As examples of the basic compounds used as the component (C-2), sodium hydroxide, potassium hydroxide, lithium hydroxide, cerium hydroxide, barium hydroxide, calcium hydroxide, pyridine, pyrrole, piperazine, pyrrolidine, piperidine, picoline, ammonia, methylamine, ethylamine, propylamine, butylamine, dimethylamine, diethylamine, dipropylamine, dibutylamine, trimethylamine, triethylamine, tripropylamine, tributylamine, monoethanolamine, diethanolamine, dimethylmonoethanolamine, monomethyldiethanolamine, triethanolamine, diazabicyclooctane, diazabicyclononane, diazabicycloundecene, urea, tetramethylammonium hydroxide, tetraethylammonium hydroxide, tetrapropylammonium hydroxide, tetrabutylammonium hydroxide, benzyltrimethylammonium hydroxide, colin, and the like can be given. Of these, ammonia, organic amines, and ammonium hydroxides can be given as preferable examples. In particular, tetramethylammonium hydroxide, tetraethylammonium hydroxide, and tetrapropylammonium hydroxide are preferable. These basic compounds used as the component (C-2) may be used either individually or in combination of two or more.

The amount of the component (C-2) to be used is usually 0.00001 to 1 mol, and preferably 0.00005 to 0.5 mol for 1 mol of the total amount of the amount of the alkoxyl groups in the component (A) (groups represented by the $R^1O—$ group, $R^2O—$ group, $R^4O—$ group, and $R^5O—$ group). If the amount of the component (C-2) is within the above range, precipitation or gelling of polymers rarely occurs during the reaction.

1.1.8 Component (D-2) and Component (E)

In the present invention, when hydrolyzing and condensing the component (A) and the component (B) in the presence of the component (C-2), (D-2) water is preferably used in an amount of 0.5 to 150 mol, and still more preferably 0.5 to 130 mol for 1 mol of the component (A) and the component (B) in total. If the amount of the water (D-2) to be added is less than 0.5 mol, cracking resistance of the resulting film may be decreased. If the amount exceeds 150 mol, precipitation or gelling of polymers may occur during the hydrolysis and condensation reaction.

In the present invention, when hydrolyzing and condensing the component (A) and the component (B) in the presence of the component (C-2), it is preferable to use an alcohol having a boiling point of 100° C. or less as the component (E) in addition to the water (D-2).

As examples of the alcohol having a boiling point of 100° C. or less used as the component (E), methanol, ethanol, n-propanol, and isopropanol can be given. The amount of the component (E) (alcohol having a boiling point of 100° C. or less) is usually 3 to 100 mol, and preferably 5 to 80 mol for 1 mol of the component (A) and the component (B) in total.

An alcohol having a boiling point of 100° C. or less may be produced when the component (A) and the component (B) are hydrolyzed and/or condensed. It is preferable to remove such an alcohol by distillation or the like so that the content is 20 wt % or less, and preferably 5 wt % or less. A dehydrating agent such as methyl orthoformate, a metal complex, or a leveling agent may be included as an additive.

As a specific process for producing the film forming composition of the present invention when using the component (C-2), the component (A) and the component (B) are added to the component (C-2) and the component (E), and are subjected to hydrolysis and condensation by intermittently or continuously adding the water (D-2). For example, the following methods (a) to (k) can be given.

(a) A method of adding a predetermined amount of the water (D-2) to a mixture of the component (A), the component (B), the component (C-2), and the component (E) to effect hydrolysis and condensation.

(b) A method of intermittently or continuously adding a predetermined amount of the water (D-2) to a mixture of the component (A), the component (B), the component (C-2), and the component (E) to effect hydrolysis and condensation.

(c) A method of adding a predetermined amount of the water (D-2) and the component (C-2) to a mixture of the component (A), the component (B), and the component (E) to effect hydrolysis and condensation.

(d) A method of intermittently or continuously adding a predetermined amount of the water (D-2) and the component (C-2) to a mixture of the component (A) and the component (E) to effect hydrolysis and condensation.

(e) A method of adding a predetermined amount of the component (A) to a mixture of the component (E), the water (D-2), and the component (C-2) to effect hydrolysis and condensation.

(f) A method of intermittently or continuously adding a predetermined amount of the component (A) to a mixture of the component (E), the water (D-2), and the component (C-2) to effect hydrolysis and condensation.

(g) A method of adding a predetermined amount of the component (A) to a mixture of the component (E), the water (D-2), and the component (C-2) to effect hydrolysis and condensation, and adding a pH adjusting agent to the resulting mixture.

(h) A method of adding a predetermined amount of the component (A) to a mixture of the component (E), the water (D-2), and the component (C-2) to effect hydrolysis and condensation, condensing the solution to a predetermined concentration, and adding a pH adjusting agent to the resulting solution.

(i) A method of extracting the solution obtained by the method of any of (a) to (h) with an organic solvent.

(j) A method of replacing the solution obtained by the method of any of (a) to (h) with an organic solvent.

(k) A method of extracting the solution obtained by the method of any of (a) to (h) with an organic solvent, and replacing the extract with another organic solvent.

As the organic solvent used in the methods of (i) to (k), at least one solvent selected from the group consisting of alcohol solvents, ketone solvents, amide solvents, ester solvents, and nonprotic solvents can be given. Examples of alcohol solvents include: monohydric alcohols such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, and diacetone alcohol; polyhydric alcohols such as ethylene glycol, 1,2-propylene glycol, 1,3-butylene glycol, pentanediol-2,4,2-methylpentanediol-2,4, hexanediol-2,5, heptanediol-2,4,2-ethylhexanediol-1,3, diethylene glycol, dipropylene glycol, triethylene glycol, and tripropylene glycol; polyhydric alcohol partial ether solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, and the like. These alcohol solvents may be used either individually or in combination of two or more.

Examples of ketone solvents include acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-i-butyl ketone, trimethylenonane, cyclohexanone, methyl cyclohexanone, 2,4-pentane dione, acetonyl acetone, acetophenone, and fenchone, as well as β-diketones such as acetylacetone, 2,4-hexanedione, 2,4-heptanedione, 3,5-heptanedione, 2,4-octanedione, 3,5-octanedione, 2,4-nonanedione, 3,5-nonanedione, 5-methyl-2,4-hexanedione, 2,2,6,6-tetramethyl-3,5-heptanedione, 1,1,1,5,5,5-hexafluoro-2,4-heptanedione, and the like. These ketone solvents may be used either individually or in combination of two or more.

Examples of amide solvents include formamide, N-methylformamide, N,N-dimethylformamide, N-ethylformamide, N,N-diethylformamide, acetamide, N-methylacetamide, N,N-dimethylacetamide, N-ethylacetamide, N,N-diethylacetamide, N-methylpropioneamide, N-methylpyrrolidone, N-formylmorpholine, N-formylpiperidine, N-formylpyrrolidine, N-acetylmorpholine, N-acetylpiperidine, N-acetylpyrrolidine, and the like. These amide solvents may be used either individually or in combination of two or more.

Examples of ester solvents include diethyl carbonate, ethylene carbonate, propylene carbonate, diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol monon-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, diethyl phthalate, and the like. These ester solvents may be used either individually or in combination of two or more. Examples of the nonprotic solvents include acetonitrile, dimethylsulfoxide, N,N,N',N'-tetraethylsulfonamide, hexamethylphosphoric acid triamide, N-methylmorphorone, N-methylpyrrole, N-ethylpyrrole, N-methyl-Δ3-pyrroline, N-methylpiperidine, N-ethylpiperidine, N,N-dimethylpiperazine, N-methylimidazole, N-methyl-4-piperidone, N-methyl-2-piperidone, N-methyl-2-pyrrolidone, 1,3-dimethyl-2-imidazolidinone, 1,3-dimethyltetrahydro-2(1H)-pyrimidinone, and the like.

1.1.9 Organic Solvent (F)

In the present invention, when hydrolyzing and condensing the component (A) and the component (B), the hydrolysis and condensation may be carried out in the organic solvent (F). The organic solvent (F) is preferably a solvent shown by the following general formula (6).

wherein $R^{10}$ and $R^{11}$ are individually a hydrogen atom, or a monovalent organic group selected from alkyl groups having 1 to 4 carbon atoms and $CH_3CO-$, and g is an integer of 1 or 2.

In the general formula (6), as examples of the alkyl groups having 1 to 4 carbon atoms, the groups given as examples for the general formula (I) can be given.

As specific examples of the organic solvent (F) shown by the general formula (6), propylene glycol monomethyl ether, propylene glycol monoethyl ether, propylene glycol monopropyl ether, propylene glycol monobutyl ether, propylene glycol dimethyl ether, propylene glycol diethyl ether, propylene glycol dipropyl ether, propylene glycol dibutyl ether, dipropylene glycol monomethyl ether, dipropylene glycol monoethyl ether, dipropylene glycol monopropyl ether, dipropylene glycol monobutyl ether, dipropylene glycol dimethyl ether, dipropylene glycol diethyl ether, dipropylene glycol dipropyl ether, dipropylene glycol dibutyl ether, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, dipropylene glycol monopropyl ether acetate, dipropylene glycol monobutyl ether acetate, propylene glycol diacetate, dipropylene glycol diacetate, and the like can be given. Of these, propylene glycol monomethyl ether, propylene glycol monoethyl ether, propylene glycol monopropyl ether, propylene glycol monobutyl ether, propylene glycol dimethyl ether, propylene glycol diethyl ether, propylene glycol monomethyl ether acetate, propylene glycol monoethyl ether acetate, and propylene glycol monopropyl ether acetate are preferable. These solvents may be used either individually or in combination of two or more. Other solvents such as the above-mentioned ester solvents and amide solvents (solvents given as examples of the organic solvents used in above methods (i) to (k), for example) may be included in a small amount in addition to the solvent shown by the general formula (6).

The gyration radius of the hydrolysis-condensation product of the component (A) and the component (B) thus obtained measured by a GPC (refractive index, viscosity, light-scattering measurement) method is preferably 4 to 50 nm, still more preferably 6 to 40 nm, and particularly preferably 7 to 30 nm. If the gyration radius of the hydrolysis-condensation product is 4 to 50 nm, the resulting silica-based film particularly excels in the relative dielectric constant, modulus of elasticity, and film uniformity. Since the hydrolysis-condensation product of the component (A) and the component (B) thus obtained is not in the shape of particles, the hydrolysis-condensation product excels in applicability to a substrate. The fact that the hydrolysis-condensation product is not in the shape of particles is confirmed by transmission electron microscope (TEM) observation, for example.

When hydrolyzing and condensing the component (A) and the component (B) in the presence of the component (C-2), it is preferable to adjust the pH of the resulting film forming composition to 7 or less after hydrolysis and condensation. As the pH adjustment method, a method of adding a pH adjusting agent, a method of evaporating the component (C-2) from the composition under normal pressure or reduced pressure, a method of removing the component (C-2) from the composition by bubbling with a gas such as nitrogen or argon, a method of removing the component (C-2) from the composition using an ion-exchange resin, a method of removing the component (C-2) from the system by extraction or washing, and the like can be given. These methods may be used in combination.

As the pH adjusting agent, inorganic acids and organic acids can be given. As examples of inorganic acids, hydrochloric acid, nitric acid, sulfuric acid, hydrofluoric acid, phosphoric acid, boric acid, oxalic acid, and the like can be given. As examples of organic acids, acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, tartaric acid, succinic acid, fumaric acid, itaconic acid, mesaconic acid, citraconic acid, malic acid, hydrolyzate of glutaric acid, hydrolyzate of maleic anhydride, hydrolyzate of phthalic anhydride, and the like can be given. These compounds may be used either individually or in combination of two or more.

The pH of the composition is adjusted to 7 or less, and preferably 1 to 6 by the pH adjusting agent. The storage stability of the resulting composition is improved by adjusting the gyration radius of the hydrolysis-condensation product to 4 to 50 nm and adjusting the pH of the composition within the above range by using the pH adjusting agent. The pH adjusting agent is used in such an amount that the pH of the composition is within the above range. The amount of the pH adjusting agent is appropriately selected.

1.2 Compound (II)

The compound (II) is a compound which is compatible with or decomposed into the hydrolysis-condensation product (I) and has a boiling point or decomposition temperature of 200 to 400° C. In the present invention, the boiling point and decomposition temperature is indicated by a temperature under atmospheric pressure. As specific examples of the compound (II), a compound having a polyalkylene oxide structure, a (meth)acrylic polymer, a vinylamide polymer, an aromatic vinyl polymer, a dendrimer, an oleophilic compound and a dispersant, ultrafine particles, a compound having a sugar chain structure, and the like can be given.

1.2.1 Compound Having a Polyalkylene Oxide Structure

As the compound having a polyalkylene oxide structure, a polymethylene oxide structure, a polyethylene oxide structure, polypropylene oxide structure, polytetramethylene oxide structure, polybutylene oxide structure, and the like can be given. Specific examples include ether compounds such as polyoxymethylene alkyl ether, polyoxyethylene alkyl ether, polyoxyethylene alkylphenyl ether, polyoxyethylene sterol ether, polyoxyethylene lanolin derivatives, ethylene oxide derivatives of alkylphenol formalin condensate, polyoxyethylene polyoxypropylene block copolymers, and polyoxyethylene polyoxypropylene alkyl ethers; ether-ester compounds such as polyoxyethylene glyceride, polyoxyethylene sorbitan fatty acid ester, polyoxyethylene sorbitol fatty acid ester, and polyoxyethylene fatty acid alkanolamide sulfate; ester compounds such as polyethylene glycol fatty acid ester (polyethylene glycol undecanoic acid ester, for example), ethylene glycol fatty acid ester, fatty acid monoglyceride, polyglycerol fatty acid ester, sorbitan fatty acid ester, propylene glycol fatty acid ester, and sucrose fatty acid ester; and the like. As a polyoxyethylene polyoxypropylene block copolymer, a compound having the following block structure can be given.

$$-(A)_j-(B)_k-(A)_l-(B)_k-(A)_l-$$

wherein A represents a group —CH$_2$CH$_2$O—, B represents a group —CH$_2$CH(CH$_3$)O—, j is an integer of 1 to 90, k is an integer of 10 to 90, and l is an integer of 0 to 90.

Of these, ether-type compounds such as polyoxyethylene alkyl ethers, polyoxyethylene polyoxypropylene block copolymers, polyoxyethylene polyoxypropylene alkyl ethers, polyoxyethylene glycerides, polyoxyethylene sorbitan fatty acid esters, polyoxyethylene sorbitol fatty acid esters, and the like are preferable. These compounds can be used either individually or in combination of two or more.

1.2.2 (Meth)acrylic Polymer

The (meth)acrylic polymer is obtained by polymerizing a compound shown by the following general formula (7) and a compound shown by the following general formula (8):

$$CH_2=CR^2COOR^{13} \quad (7)$$

wherein R represents a hydrogen atom or a methyl group, and R$^{13}$ represents a monovalent aliphatic hydrocarbon group;

$$CH_2=CR^{14}COOR^{15} \quad (8)$$

wherein R$^{14}$ represents a hydrogen atom or a methyl group, and R$^{15}$ represents a functional group including a heteroatom.

In the general formula (7), as examples of the monovalent aliphatic hydrocarbon group represented by R$^{14}$, an alkyl group, an alkenyl group, and an alkynyl group having 1 to 12 carbon atoms can be given. The aliphatic hydrocarbon group may be either linear or branched, or may form a ring. The aliphatic hydrocarbon group is preferably a methyl group, ethyl group, n-propyl group, iso-propyl group, n-butyl group, iso-butyl group, sec-butyl group, n-butyl group, hexyl group, or cyclohexyl group.

As examples of compounds preferable as the compounds shown by the general formula (7), monoacrylates such as methyl acrylate, ethyl acrylate, n-propyl acrylate, iso-propyl acrylate, n-butyl acrylate, iso-butyl acrylate, sec-butyl acrylate, tert-butyl acrylate, amyl acrylate, hexyl acrylate, heptyl acrylate, octyl acrylate, nonyl acrylate, decyl acrylate, dodecyl acrylate, tetradecyl acrylate, hexadecyl acrylate, octadecyl acrylate, cyclohexyl acrylate, 2-ethylhexyl acrylate, and isobornyl acrylate; and monomethacrylates such as methyl methacrylate, ethyl methacrylate, n-propyl methacrylate, iso-propyl methacrylate, n-butyl methacrylate, iso-butyl methacrylate, sec-butyl methacrylate, tert-butyl methacrylate, amyl methacrylate, hexyl methacrylate, heptyl methacrylate, octyl methacrylate, nonyl methacrylate, decyl methacrylate, dodecyl methacrylate, tetradecyl methacrylate, hexadecyl methacrylate, octadecyl methacrylate, cyclohexyl methacrylate, 2-ethylhexyl methacrylate, and isobornyl methacrylate can be given.

In the general formula (8), as examples of the functional group including a heteroatom represented by R$^{15}$, an alkyl group including at least one group selected from the group consisting of a hydroxyl group, alkoxy group, ether group, polyoxyalkyl group, carboxyl group, carbonyl group, ester group, amide group, and imide group. The functional group may be either linear or branched, or may form a ring. Of these groups, a hydroxyl group, alkoxy group, ether group, and polyoxyalkyl group are preferable.

As examples of compounds preferable as the compounds shown by the general formula (8), monoacrylates such as 2-methoxyethyl acrylate, 2-ethoxyethyl acrylate, 2-methoxypropyl acrylate, 2-ethoxypropyl acrylate, phenylcarbitol acrylate, nonylphenylcarbitol acrylate, dicyclopentenyloxyethyl acrylate, tetrahydrofurfuryl acrylate, 2-hydroxyethyl acrylate, diethylene glycol acrylate, polyethylene glycol acrylate, methoxydiethylene glycol acrylate, methoxypolyethylene glycol acrylate, ethoxydiethylene glycol acrylate, ethoxypolyethylene glycol acrylate, 2-hydroxypropyl acrylate, dipropylene glycol acrylate, polypropylene glycol acrylate, methoxydipropylene glycol acrylate, methoxypolypropylene glycol acrylate, ethoxydipropylene glycol acrylate, ethoxypolypropylene glycol acrylate, 2-dimethylaminoethyl acrylate, 2-diethylaminoethyl acrylate, and glycidyl acrylate; and monomethacrylates such as 2-methoxyethyl methacrylate, 2-ethoxyethyl methacrylate, 2-methoxypropyl methacrylate, 2-ethoxypropyl methacrylate, phenylcarbitol methacrylate, nonylphenylcarbitol methacrylate, dicyclopentenyloxyethyl methacrylate, and tetrahydrofurfuryl methacrylate can be given.

The compound shown by the general formula (7) or (8) may be used individually or in combination of two or more. In the film forming composition of the present invention, the polystyrene-reduced number average molecular weight of the (meth)acrylic polymer is 1,000 to 100,000, and preferably 2,000 to 20,000.

1.2.3 Vinylamide Polymer

As examples of the vinylamide polymer, poly(N-vinylacetamide), poly(N-vinylpyrrolidone, poly(2-methyl-2-oxazoline), and poly(N,N-dimethylacrylamide), and the like can be given.

1.2.4 Aromatic Vinyl Polymer

As examples of the aromatic vinyl polymer, polystyrene, polymethylstyrene, poly-α-methylstyrene, and the like can be given.

1.2.5 Dendrimer

As examples of the dendrimer, benzyl ether dendrimers, phenylacetylene, polyamine dendrimers, and polyamide dendrimers can be given. Of these, polyamine dendrimers are preferable from the viewpoint of thermal decomposability.

1.2.6 Oleophilic Compound and Dispersant

The oleophilic compound and dispersant is not compatible with the hydrolysis-condensation product (I) in a wide composition range, but becomes compatible with the hydrolysis-condensation product (I) in a wide composition range in the presence of the dispersant. As the oleophilic compound, polycarboxylic acid esters such as didecyl phthalate, diundecyl phthalate, didodecyl phthalate, ditridecyl phthalate, tris(2-ethylhexyl)trimellitate, tridecyl trimellitate, tridodecyl trimellitate, tetrabutyl pyromellitate, tetrahexyl trimellitate, tetraoctyl pyromellitate, bis(2-ethylhexyl)dodecane dioate, and bisdecyldodecane dioate can be given. As the dispersant which makes these oleophilic compound compatible, higher alcohols such as octanol, lauryl alcohol, decyl alcohol, and undecyl alcohol can be given. The amount of the higher alcohol used as the dispersant is the range of 0.1 to 10 times (weight) as that of the oleophilic compound.

1.2.7 Ultrafine Particles

The ultrafine particles are polymer particles having a particle size of 100 nm or less. The particle size of the ultrafine particles is controlled by the type of an emulsifier, emulsifier concentration, stirring speed, and the like in normal emulsion polymerization. The ultrafine particles are prepared from monomers of an aromatic vinyl compound or a (meth)acrylate compound using a crosslinkable monomer for controlling the particle size.

1.2.8 Compound Having a Sugar Chain Structure

As examples of the compound having a sugar chain structure, cyclodextrin, sucrose ester, oligosaccharide, glucose, fructose, mannitol, starch sugar, D-sorbitol, dextran, xanthan gum, curdlan, pullulan, cycloamylose, isomerized sugar, maltitol, cellulose acetate, cellulose, carboxymethyl cellulose, hydroxyethyl cellulose, hydroxypropyl cellulose, methyl cellulose, ethylhydroxyethyl cellulose, carboxymethyl cellulose, chitin, chitosan, and the like can be given.

In the film forming composition of the present invention, it is preferable to use the compound having a polyalkylene oxide structure or the (meth)acrylic polymer as the compound (II).

In the film forming composition of the present invention, the amount of the compound (II) to be used is 5 to 200 parts by weight, and preferably from 5 to 50 parts by weight for 100 parts by weight of the hydrolysis-condensation product (I) (converted into complete hydrolysis-condensation product). If the amount of the compound (II) is 5 to 200 parts by weight, the effect of decreasing the relative dielectric constant of the silica-based film formed by using the film forming composition of the present invention is increased.

1.3 Organic Solvent (III)

It is preferable to use an alkylene glycol solvent as the organic solvent (III). As examples of the alkylene glycol solvents, propylene glycol monomethyl ether, propylene glycol monoethyl ether, propylene glycol monopropyl ether, propylene glycol monoisopropyl ether, propylene glycol monobutyl ether, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxytriglycol, tetraethylene glycol di-n-butyl ether, tripropylene glycol monomethyl ether, tetrahydrofuran, 2-methyltetrahydrofuran, propylene glycol dimethyl ether, propylene glycol diethyl ether, propylene glycol dipropyl ether, propylene glycol dibutyl ether, dipropylene glycol monomethyl ether, dipropylene glycol monoethyl ether, dipropylene glycol monopropyl ether, dipropylene glycol monobutyl ether, dipropylene glycol dimethyl ether, dipropylene glycol diethyl ether, dipropylene glycol dipropyl ether, and dipropylene glycol dibutyl ether can be given. These solvents may be used either individually or in combination of two or more.

The film forming composition of the present invention preferably includes the alkylene glycol solvent as the organic solvent (III). The film forming composition of the present invention may include other solvents given below in an amount of 50 wt % or less of the organic solvent. Examples of organic solvents which can be used in the present invention include: aliphatic hydrocarbon solvents such as n-pentane, i-pentane, n-hexane, i-hexane, n-heptane, i-heptane, 2,2,4-trimethylpentane, n-octane, i-octane, cyclohexane, and methylcyclohexane; aromatic hydrocarbon solvents such as benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, n-amylnaphthalene, and trimethylbenzene; ketone solvents such as acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-i-butyl ketone, trimethyl nonanone, cyclohexanone, 2-hexanone, methylcyclohexanone, 2,4-pentanedione, acetonylacetone, diacetone alcohol, acetophenone, and fenchone; ether solvents such as ethyl ether, i-propyl ether, n-butyl ether, n-hexyl ether, 2-ethylhexyl ether, ethylene oxide, 1,2-propylene oxide, dioxolane, 4-methyldioxolane, dioxane, and dimethyldioxane; ester solvents such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetoate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents such as N-methylformamide, N,N-dimethylformamide, N,N-diethylformamide, acetamide, N-methyl acetamide, N,N-dimethylacetamide, N-methylpropioneamide, and N-methylpyrrolidone; sulfur-containing solvents such as dimethyl sulfide, diethyl sulfide, thiophene, tetrahydrothiophene, dimethylsulfoxide, sulfolane, and 1,3-propanesultone; and the like. These solvents may be used either individually or in combination of two or more.

1.3.1 Surfactant

The film forming composition of the present invention preferably includes a surfactant. As examples of surfactants, nonionic surfactants, anionic surfactants, cationic surfactants, and amphoteric surfactants can be given. These may be a fluorine-containing surfactant, silicone-containing surfactant, polyalkylene oxide surfactant, poly(meth)acrylate surfactant, or the like. Of these, fluorine-containing surfactants and/or silicone-containing surfactants is preferably included in the film forming composition of the present invention.

As examples of fluorine-containing surfactants, compounds having a fluoroalkyl or fluoroalkylene group in at least one of the molecular terminal, the main chain, or the side chain such as 1,1,2,2-tetrafluorooctyl(1,1,2,2-tetrafluoropropyl)ether, 1,1,2,2-tetrafluorooctylhexyl ether, octaethylene glycol di(1,1,2,2-tetrafluorobutyl)ether, hexaethylene glycol (1,1,2,2,3,3-hexafluoropentyl)ether, octapropylene glycol di(1,1,2,2-tetrafluorobutyl)ether, hexapropylene glycol di(1,1,2,2,3,3-hexafluoropentyl)ether, sodium perfluorododecyl sulfonate, 1,1,2,2,8,8,9,9,10,10-decafluorododecane, 1,1,2,2,3,3-hexafluorodecane, N-3-(perfluorooctanesulfonamide)-propyl-N,N'-dimethyl-N-carboxymethylene ammonium betaine, perfluoroalkyl sulfonamide propyltrimethyl ammonium salt, perfluoroalkyl-N-ethylsulfonyl glycine salt, bis(N-perfluorooctylsulfonyl-N-ethylaminoethyl)phosphate, and monoperfluoroalkylethyl phosphate can be given. As examples of commercially available products of fluorine-containing surfactants, Megafac F142D, F172, F173, F183 (manufactured by Dainippon Ink and Chemicals, Inc.), Eftop EF301, EF303, EF352 (manufactured by Sin-Akita Kasei Co., Ltd.). Fluorad FC-430, FC-431 (manufactured by Sumitomo 3M Co., Ltd.), Asahi Guard AG710, Surflon S-382, SC-101, SC-102, SC-103, SC-104, SC-105, SC-106 (manufactured by Asahi Glass Co., Ltd.), BM-1000, BM-1100 (manufactured by BM Chemie), and NBX-15 (manufactured by NEOS Co., Ltd.) can be given. Of these, Megafac F172, BM-1000, BM-1100, and NBX-15 are particularly preferable.

As silicone-containing surfactants, SH7PA, SH21PA, SH30PA, ST94PA (manufactured by Toray-Dow Corning Silicone Co., Ltd.) and the like may be used. Of these, a polymer shown by the following general formula (9) which corresponds to SH28PA and SH30PA is particularly preferable.

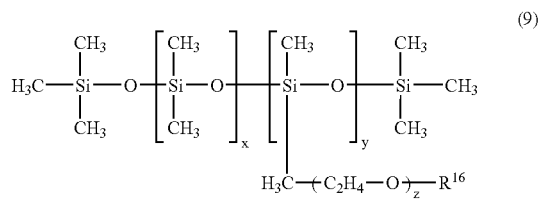

(9)

wherein $R^{16}$ represents a hydrogen atom or an alkyl group having 1 to 5 carbon atoms, z represents an integer of 1 to 20, and x and y individually represent integers of 2 to 100.

The amount of the surfactant to be used is usually 0.0001 to 10 parts by weight for 100 parts by weight of the component (A) (converted into complete hydrolysis-condensation product). These surfactants may be used either individually or in combination of two or more.

The film forming composition of the present invention may further include components such as colloidal silica, colloidal alumina, silane coupling agent, radical generator, and triazene compound.

Colloidal silica is a dispersion liquid of high purity silicic anhydride in a hydrophilic organic solvent, and generally has an average particle size of 5 to 30 µm, and preferably 10 to 20 µm, and a solid content of about 10 to 40 wt %, wherein silica particles. Such colloidal silica is commercially available as methanol silica sol or isopropanol silica sol (manufactured by Nissan Chemical Industries, Ltd.) and Oscal (manufactured by Catalysts & Chemicals Ind. Co., Ltd.).

The colloidal alumina is commercially available as Alumina Sol 520™, Alumina Sol 100™, or Alumina Sol 200™ (manufactured by Nissan Chemical Industries, Ltd.), and Alumina Clear Sol™, Alumina Sol 10™, or Alumina Sol 132™(manufactured by Kawaken Fine Chemicals Co., Ltd.).

As examples of organic polymers, compounds with a sugar chain structure, vinylamide polymers, (meth)acrylic polymers, aromatic vinyl compounds, dendrimers, polyimides, polyamic acids, polyarylenes, polyamides, polyquinoxalines, polyoxadizoles, fluorine-containing polymers, and the like can be given.

As examples of silane coupling agents, 3-glycidyloxypropyltrimethoxysilane, 3-aminoglycidyloxypropyltriethoxysilane, 3-methacryloxypropyltrimethoxysilane, 3-glycidyloxypropylmethyldimethoxysilane, 1-methacryloxypropylmethyldimethoxysilane, 3-aminopropyltrimethoxysilane, 3-aminopropyltriethoxysilane, 2-aminopropyltrimethoxysilane, 2-aminopropyltriethoxysilane, N-(2-aminoethyl)-3-aminopropyltrimethoxysilane, N-(2-aminoethyl)-3-aminopropylmethyldimethoxysilane, 3-ureidopropyltrimethoxysilane, 3-ureidopropyltriethoxysilane, N-ethoxycarbonyl-3-aminopropyltrimethoxysilane, N-ethoxycarbonyl-3-aminopropyltriethoxysilane, N-triethoxysilylpropyltriethylenetriamine, N-triethoxysilylpropyltriethylenetriamine, 10-trimethoxysilyl-1,4,7-triazadecane, 10-triethoxysilyl-1,4,7-triazadecane, 9-trimethoxysilyl-3,6-diazanonylacetate, 9-triethoxysilyl-3,6-diazanonylacetate, N-benzyl-3-aminopropyltrimethoxysilane, N-benzyl-3-aminopropyltriethoxysilane, N-phenyl-3-aminopropyltrimethoxysilane, N-phenyl-3-aminopropyltriethoxysilane, N-bis(oxyethylene)-3-aminopropyltrimethoxysilane, N-bis(oxyethylene)-3-aminopropyltriethoxysilane, and the like can be given. These componds may be used either individually or in combination of two or more.

As examples of radical generators, isobutyryl peroxide, α,α'-bis(neodecanoylperoxy)diisopropylbenzene, cumylperoxyneodecanoate, di-npropylperoxydicarbonate, diisopropylperoxydicarbonate, 1,1,3,3-tetramethylbutylperoxyneodecanoate, bis(4-t-butylcyclohexyl)peroxydicarbonate, 1-cyclohexyl-1-methylethylperoxyneodecanoate, di-2-ethoxyethylperoxydicarbonate, di(2-ethylhexylperoxy)dicarbonate, t-hexylperoxyneodecanoate, dimethoxybutylperoxydicarbonate, di(3-methyl-3-methoxybutylperoxy)dicarbonate, t-butylperoxyneodecanoate, 2,4-dichlorobenzoyl peroxide, t-hexylperoxy pivalate, t-butylperoxy pivalate, 3,5,5-trimethylhexanoyl peroxide, octanoyl peroxide, lauroyl peroxide, stearoyl peroxide, 1,1,3,3-tetramethylbutylperoxy 2-ethylhexanoate, succinic peroxide, 2,5-dimethyl-2,5-di(2-ethylhexanoylperoxy)hexane, 1-cyclohexyl-1-methylethylperoxy 2-ethylhexanoate, t-hexylperoxy 2-ethylhexanoate, t-butylperoxy 2-ethylhexanoate, m-toluoylbenzoyl peroxide, benzoyl peroxide, t-butylperoxy isobutyrate, di-t-butylperoxy-2-methylcyclohexane, 1,1-bis(t-hexylperoxy)-3,3,5-trimethylcyclohexane, 1,1-bis(t-hexylperoxy)cyclohexane, 1,1-bis(t-butylperoxy)-3,3,5-trimethylcyclohexane, 1,1-bis(t-butylperoxy)cyclohexane, 2,2-bis(4,4-di-t-butylperoxycyclohexyl)propane, 1,1-bis(t-butylperoxy)cyclodecane, t-hexylperoxyisopropylmonocarbonate, t-butylperoxymaleic acid, t-butylperoxy-3,3,5-trimethylhexanoate, t-butylperoxy laurate, 2,5-dimethyl-2,5-di(m-toluoylperoxy)hexane, t-butylperoxyisopropylmonocarbonate, t-butylperoxy-2-ethylhexylmonocarbonate, t-hexylperoxy benzoate, 2,5-dimethyl-2,5-di(benzoylperoxy)hexane, t-butylperoxy acetate, 2,2-bis(t-butylperoxy)butane, t-butylperoxy benzoate, n-butyl-4,4-bis(t-butylperoxy)valerate, di-t-butylperoxy iso-phthalate, α,α'-bis(t-butylperoxy)diisopropylbenzene, dicumyl peroxide, 2,5-dimethyl-2,5-di(t-butylperoxy)hexane, t-butylcumyl peroxide, di-t-butyl peroxide, p-menthane hydroperoxide, 2,5-dimethyl-2,5-di(t-butylperoxy)hexin-3, diisopropylbenzene hydroperoxide, t-butyltrimethylsilyl peroxide, 1,1,3,3-tetramethylbutyl hydroperoxide, cumene hydroperoxide, t-hexyl hydroperoxide, t-butyl hydroperoxide, 2,3-dimethyl-2,3-diphenylbutane, and the like can be given. The amount of radical generator to be used is preferably 0.1 to 10 parts by weight for 100 parts by weight of the polymers. These compounds may be used either individually or in combination of two or more.

Examples of triazene compounds include 1,2-bis(3,3-dimethyltriazenyl)benzene, 1,3-bis(3,3-dimethyltriazenyl)benzene, 1,4-bis(3,3-dimethyltriazenyl)benzene, bis(3,3-dimethyltriazenylphenyl)ether, bis(3,3-dimethyltriazenylphenyl)methane, bis(3,3-dimethyltriazenylphenyl)sulfone, bis(3,3-dimethyltriazenylphenyl)sulfide, 2,2-bis[4-(3,3-dimethyltriazenylphenoxy)phenyl]-1,1,1,3,3,3-hexafluoropropane, 2,2-bis[4-(3,3-dimethyltriazenylphenoxy)phenyl]propane, 1,3,5-tris(3,3-dimethyltriazenyl)benzene, 2,7-bis(3,3-dimethyltriazenyl)-9,9-bis[4-(3,3-dimethyltriazenyl)phenyl]fluorene, 2,7-bis(3,3-dimethyltriazenyl)-9,9-bis[3-methyl-4-(3,3-dimethyltriazenyl)phenyl]fluorene, 2,7-bis(3,3-dimethyltriazenyl)-9,9-bis[3-phenyl-4-(3,3-dimethyltriazenyl)phenyl]fluorene, 2,7-bis(3,3-dimethyltriazenyl)-9,9-bis[3-propenyl-4-(3,3-dimethyltriazenyl)phenyl]fluorene, 2,7-bis(3,3-dimethyltriazenyl)-9,9-bis[3-fluoro-4-(3,3-dimethyltriazenyl)phenyl]fluorene, 2,7-bis(3,3-dimethyltriazenyl)-9,9-bis[3,5-difluoro-4-(3,3-dimethyltriazenyl)phenyl]fluorene, 2,7-bis(3,3-dimethyltriazenyl)-9,9-bis[3-trifluoromethyl-4-(3,3-dimethyltriazenyl)phenyl]fluorene, and the like. These compounds may be used either individually or in combination of two or more.

The total solid content of the film forming composition of the present invention is preferably 2 to 30 wt %, and is appropriately adjusted corresponding to the use. If the total solid content of the film forming composition of the present invention is 2 to 30 wt %, the thickness of the resulting film is within an appropriate range, and the composition exhibits more excellent storage stability. The total solid content is adjusted by concentration or dilution with an organic solvent, if necessary.

The film forming composition of the present invention can form a uniform film, and suitable as an insulating film formation material due to low relative dielectric constant. Specifically, a silica-based film can be obtained by applying the film forming composition of the present invention and sintering the applied composition. Since the silica-based film has a low relative dielectric constant, the silica-based film is useful for applications such as an interlayer dielectric for semiconductor devices such as an LSI, system LSI, DRAM, SDRAM, RDRAM, and D-RDRAM, a protective film such as a surface coat film for semiconductor devices, an intermediate layer in the semiconductor manufacturing process using a multi-layer resist, an interlayer dielectric of a multi-layer interconnect substrate, and a protective film and an insulation film for a liquid crystal display device.

2. Film Formation Process and Silica-Based Film

When forming a silica-based film (insulating film) using the film forming composition of the present invention, the film forming composition of the present invention is applied to a substrate to form a film. As the substrate to which the film forming composition of the present invention can be applied, a semiconductor substrate, a glass substrate, a ceramic substrate, a metal substrate, and the like can be given. As the application method, spin coating, dipping, roller blade, spray method, and the like can be given. A film with a dry thickness of about 0.05 to 1.5 μm is formed by a single application, and a film with a dry thickness of about 0.1 to 3 μm is formed by a double application. When forming an interlayer dielectric, the thickness of the film is usually 0.2 to 20 μm.

The formed film is subjected to at least one type of processing consisting of heating, electron beam irradiation, ultraviolet irradiation, and oxygen plasma processing. When performing a heat treatment, the heating temperature is preferably less than the boiling point or the decomposition temperature of the compound (II). In the present invention, it is preferable to select the heating condition of the film so that the density of the hydrolysis-condensation product (I) in the film is decreased.

As the heating method, a method of heating the formed film at a temperature less than the boiling point or the decomposition temperature of the compound (II) to cure the hydrolysis-condensation product (I), and completely curing the film by heating the film from a temperature equal to or greater than the boiling point or the decomposition temperature of the compound (II) to the final curing temperature to obtain a silica-based film can be given. According to this method, the density of the resulting silica-based film can be decreased.

When curing the film, the film is dried at room temperature or dried by heating the film at about 80 to 600° C. for about 5 to 240 minutes, for example. As a specific heating method, a hot plate, an oven, a furnace, or the like may be used. The film may be heated in air, in nitrogen, in argon, under vacuum, or under reduced pressure in which the oxygen concentration is controlled. In order to control the curing speed of the film, step-wise heating may be performed, or atmosphere such as nitrogen, air, oxygen, and reduced pressure may be selected, if necessary.

In order to control the curing speed of the hydrolysis-condensation product (I) and the evaporation or decomposition speed of the organic solvent (III), the film may be heated step-wise, if necessary. Since the boiling point or the decomposition temperature of the compound (II) is 200 to 450° C., the film is heated to this temperature or more. This step is preferably carried out under reduced pressure or in an inert gas atmosphere.

The MP film density of the silica-based film obtained by heating the film forming composition of the present invention by the film formation method of the present invention is usually 0.35 to 1.2 g/cm$^3$, preferably 0.4 to 1.1 g/cm$^3$, and still more preferably 0.5 to 1.0 g/cm3. The silica-based film of the present invention may be in a porous state or may have interstices at the molecular level and in a uniform low-density state. The relative dielectric constant of the silica-based film of the present invention is usually 1.2 to 2.6.

3. EXAMPLES

The present invention is described below in more detail by examples. In the examples and comparative examples, "part" and "%" respectively indicate "part by weight" and "wt %" unless otherwise indicated. The following description generally shows aspects of the present invention, and should not be construed as limiting the present invention.

3.1 Example 1

A film was formed by the following method using compositions (reaction liquids 1 to 7) obtained in this example.

3.1.1 Formation of Film 0.006 g of a surfactant NBX-15 was added to 100 g of each of compositions (reaction liquids 1 to 7) obtained in Synthesis Examples 1 to 5 and Comparative Examples 1 and 2, and the mixture was filtered using a filter with a pore size of 0.02 μm. Since no residual substance was observed in the filter, the mixture could be filtered.

The composition after filtration was applied to an 8-inch silicon wafer using a spin coating method. The wafer was heated at 80° C. for five minutes in air, at 200° C. for five minutes in nitrogen atmosphere, and at 400° C. for one hour under vacuum to obtain a colorless transparent film (silica-based film). The film was formed for each composition. The film was evaluated under the following conditions. The results are shown in Table 1.

3.1.2 Evaluation Method

CMP Resistance

The film was subjected to CMP under the following conditions.

Slurry: silica-hydrogen peroxide
Polishing pressure: 200 g/cm$^2$
Polishing time: 40 seconds The appearance of the film after CMP was observed using a 350,000-1×surface observation lamp, and was evaluated according to the following criteria.

A: No change was observed.
B: Cracks or peeling was observed in the film.

Adhesion 10 stud pins were secured on the wafer on which the film was formed by the above method using an epoxy resin, and the wafer was dried at 150° C. for one hour. A tensile test was carried out for the stud pins using a Sebastian method to evaluate adhesion according to the following criteria.

A: Delamination did not occur at the interface between the silicon wafer and the film for the 10 stud pins.
B: Delamination occurred at the interface between the silicon wafer and the film for one of the 10 stud pins.

Chemical Resistance

The wafer on which the film was formed by the above method was immersed in a 0.2 wt % diluted hydrofluoric acid aqueous solution at room temperature for one minute, and the change in thickness of the film before and after immersion was observed. The chemical resistance was judged to be excellent when the residual film rate defined below was 99% or more.

Residual film rate (%)=(film thickness after immersion)/(film thickness before immersion)×100

Relative Dielectric Constant

Aluminum was deposited on the wafer on which the film was formed by the above method to form a dielectric constant evaluation substrate. The relative dielectric constant was calculated from the capacitance at 10 kHz using HP16451B™ electrode and HP4284A™ precision LCR meter (manufactured by Yokokawa Hewlett Packard Co., Ltd).

Synthesis Example 1

In a separable flask made of quartz, 286.08 g of distilled methyltrimethoxysilane, 91.34 g of distilled tetramethoxysilane, and 88.99 g of octamethylcyclotetrasiloxane (compound in which X=methyl group, Y=methyl group, and n=4 in the general formula (4)) were dissolved in 1,030 g of distilled propylene glycol monoethyl ether. The mixture was stirred using a three one motor to stabilize the solution temperature at 50° C. Then, 267.6 g of ion-exchanged water, in which 1.07 g of itaconic acid was dissolved, was added to the solution in one hour. The mixture was allowed to react at 50° C. for three hours. After the addition of 794 g of distilled propylene glycol monoethyl ether, the reaction liquid was cooled to room temperature. 794 g of a solution containing methanol was removed from the reaction liquid at 50° C. under reduced pressure to obtain a film forming composition (reaction liquid 1).

Synthesis Example 2

In a separable flask made of quartz, 286.08 g of distilled methyltrimethoxysilane, 91.34 g of distilled tetramethoxysilane, and 72.16 g of 1,3,5,7-tetramethylcyclotetrasiloxane (compound in which X=hydrogen atom, Y=methyl group, and n=4 in the general formula (4)) were dissolved in 935 g of distilled propylene glycol monomethyl ether acetate. The mixture was stirred using a three one motor to stabilize the solution temperature at 50° C. Then, 267.6 g of ion-exchanged water, in which 0.75 g of oxalic acid was dissolved, was added to the solution in one hour. The mixture was allowed to react at 50° C. for one hour. After the addition of 744 g of distilled propylene glycol monomethyl ether acetate, the reaction liquid was cooled to room temperature. 744 g of a solution containing methanol was removed from the reaction liquid at 50° C. under reduced pressure to obtain a film forming composition (reaction liquid 2).

Synthesis Example 3

In a separable flask made of quartz, 286.08 g of distilled methyltrimethoxysilane, 91.34 g of distilled tetramethoxysilane, and 103.40 g of 1,3,5,7-tetravinyl-1,3,5,7-tetramethyl-cyclotetrasiloxane (compound in which X=vinyl group, Y=methyl group, and n=4 in the general formula (4)) were dissolved in 1,113 g of distilled propylene glycol monoethyl ether. The mixture was stirred using a three one motor to stabilize the solution temperature at 50° C. Then, 267.6 g of ion-exchanged water, in which 0.97 g of succinic acid was dissolved, was added to the solution in one hour. The mixture was allowed to react at 50° C. for three hours. After the addition of 838 g of distilled propylene glycol monoethyl ether, the reaction liquid was cooled to room temperature. 838 g of a solution containing methanol was removed from the reaction liquid at 50° C. under reduced pressure to obtain a film forming composition (reaction liquid 3).

Synthesis Example 4

In a separable flask made of quartz, 163.48 g of distilled methyltrimethoxysilane, 91.34 g of distilled tetramethoxysilane, 59.33 g of octamethylcyclotetrasiloxane (compound in which X=methyl group, Y=methyl group, and n=4 in the general formula (4)), and 0.018 g of tetrakis(acetylacetonate) titanium were dissolved in 364.11 g of distilled dipropylene glycol dimethyl ether. The mixture was stirred using a three one motor to stabilize the solution temperature at 50° C. Then, 151 g of ion-exchanged water was added to the solution in one hour. The mixture was allowed to react at 50° C. for three hours. After the addition of 498 g of distilled dipropylene glycol dimethyl ether, the reaction liquid was cooled to room temperature. 498 g of a solution containing methanol was removed from the reaction liquid at 50° C. under reduced pressure to obtain a film forming composition (reaction liquid 4).

Synthesis Example 5

In a separable flask made of quartz, 163.48 g of distilled methyltrimethoxysilane, 91.34 g of distilled tetramethoxysilane, 48.11 g of 1,3,5,7-tetramethylcyclotetrasiloxane (compound in which X=hydrogen atom, Y=methyl group, and n=4 in the general formula (4)), and 0.007 g of tetrakis(acetylacetonate)titanium were dissolved in 364.11 g of distilled dipropylene glycol dimethyl ether. The mixture was stirred using a three one motor to stabilize the solution temperature at 50° C. Then, 151 g of ion-exchanged water was added to the solution in one hour. The mixture was allowed to react at 50° C. for three hours. After the addition of 494 g of distilled dipropylene glycol dimethyl ether, the reaction liquid was cooled to room temperature. 494 g of a solution containing methanol was removed from the reaction liquid at 50° C. under reduced pressure to obtain a film forming composition (reaction liquid 5).

Synthesis Example 6

In a separable flask made of quartz, 286.08 g of distilled methyltrimethoxysilane, 204.34 g of distilled bis(triethoxysilyl)methane, and 88.99 g of octamethylcyclotetrasiloxane (compound in which X=methyl group, Y=methyl group, and n=4 in the general formula (4)) were dissolved in 1,125 g of distilled propylene glycol monomethyl ether acetate. The mixture was stirred using a three one motor to stabilize the solution temperature at 50° C. Then, 300.0 g of ion-exchanged water, in which 0.83 g of oxalic acid was dissolved, was added to the solution in one hour. The mixture was allowed to react at 50° C. for one hour. After the addition of 903 g of distilled propylene glycol monomethyl ether acetate, the reaction liquid was cooled to room temperature. 903 g of a solution containing methanol was removed from the reaction liquid at 50° C. under reduced pressure to obtain a film forming composition (reaction liquid 6).

Comparative Example 1

In a separable flask made of quartz, 217.97 g of distilled methyltrimethoxysilane and 60.89 g of distilled tetramethoxysilane were dissolved in 417.66 g of distilled propylene glycol monoethyl ether. The mixture was stirred using a three one motor to stabilize the solution temperature at 50° C. Then, 173 g of ion-exchanged water, in which 0.70 g of itaconic acid was dissolved, was added to the solution in one hour. The mixture was allowed to react at 50° C. for three hours. After the addition of 392 g of distilled propylene glycol monoethyl ether, the reaction liquid was cooled to room temperature. 392 g of a solution containing methanol was removed from the reaction liquid at 50° C. under reduced pressure to obtain a film forming composition (reaction liquid 7).

Comparative Example 2

In a separable flask made of quartz, 217.97 g of distilled methyltrimethoxysilane, 60.89 g of distilled tetramethoxysilane, and 0.073 g of tetrakis(acetylacetonate)titanium were dissolved in 200.88 g of distilled dipropylene glycol dimethyl ether. The mixture was stirred using a three one motor to stabilize the solution temperature at 50° C. Then, 172.99 g of ion-exchanged water was added to the solution in one hour. The mixture was allowed to react at 50° C. for three hours. After the addition of 392 g of distilled dipropylene glycol dimethyl ether, the reaction liquid was cooled to room temperature. 392 g of a solution containing methanol was removed from the reaction liquid at 50° C. under reduced pressure to obtain a film forming composition (reaction liquid 8).

TABLE 1

| | Composition | Relative dielectric constant | Chemical resistance | Adhesion | Residual film rate (%) |
|---|---|---|---|---|---|
| Synthesis Example 1 | Reaction liquid 1 | 2.6 | A | A | 99 |
| Synthesis Example 2 | Reaction liquid 2 | 2.7 | A | A | 100 |
| Synthesis Example 3 | Reaction liquid 3 | 2.6 | A | A | 100 |
| Synthesis Example 4 | Reaction liquid 4 | 2.6 | A | A | 100 |
| Synthesis Example 5 | Reaction liquid 5 | 2.5 | A | A | 100 |
| Synthesis Example 6 | Reaction liquid 6 | 2.7 | A | A | 99 |
| Comparative Example 1 | Reaction liquid 7 | 2.6 | B | B | 10 |
| Comparative Example 2 | Reaction liquid 8 | 2.7 | B | B | 0 |

In Example 1, as shown in Table 1, it was confirmed that a composition exhibiting excellent chemical resistance and adhesion can be obtained according to Synthesis Examples 1 to 6 by hydrolyzing and condensing the component (A) and the component (B) in the presence of the component (C-1). It was confirmed from Comparative Example 1 that chemical resistance and adhesion are decreased when the component (B) is not added. It was confirmed from Comparative Example 2 that chemical resistance and adhesion are decreased when the component (C-1) is not present.

3.2 Example 2

A film was formed by the following method using composition solutions (A-1 to A-5) obtained in this example.

3.2.1 Formation of Film

Each of compositions (A-1 to A-5 and B-1 and B-2) obtained in Synthesis Examples 6 to 11 and Comparative Examples 3 and 4 was filtered using a filter with a pore size of 0.02 μm. Since no residual substance was observed in the filter, the composition could be filtered.

The composition after filtration was applied to an 8-inch silicon wafer using a spin coating method. The wafer was heated at 80° C. for five minutes in air, at 200° C. for five minutes in nitrogen atmosphere, and at 400° C. for one hour under vacuum to obtain a colorless transparent film (silica-based film). The film was formed for each composition. The resulting film was evaluated under the following conditions. The results are shown in Table 2.

3.2.2 Evaluation Method

Chemical Resistance

The wafer on which the film was formed by the above method was immersed in a 0.2 wt % diluted hydrofluoric acid aqueous solution at room temperature for one minute, and a change in thickness of the film before and after immersion was observed. The chemical resistance was judged to be excellent when the residual film rate defined below was 99% or more.

Residual film rate (%)=(film thickness after immersion)/(film thickness before immersion)×100

Degassing Characteristics

The wafer after being immersed in a diluted hydrofluoric acid aqueous solution for measuring chemical resistance was heated to 450° C. using a thermal desorption spectrometer manufactured by ESCO Co., Ltd. (EMD-WA1000S) to measure the amount of desorption water. The amount of desorption water was evaluated according to the following criteria by comparison between before and after immersion.

A: The amount of desorption water is equal to or less than that of the film before immersion.

B: The amount of desorption water exceeds that of the film before immersion.

Relative dielectric constant

Aluminum was deposited on the wafer on which the film was formed by the above method to form a dielectric constant evaluation substrate. The relative dielectric constant was calculated from the capacitance at 10 kHz using HP16451B™ electrode and HP4284A™ precision LCR meter (manufactured by Yokokawa Hewlett Packard Co., Ltd).

Synthesis Example 7

74.9 g of methyltrimethoxysilane (36.7 g when converted into complete hydrolysis-condensation product), 83.3 g of tetraethoxysilane (24.2 g when converted into complete hydrolysis-condensation product), and 14.8 g of octamethylcyclotetrasiloxane (compound in which X=methyl group, Y=methyl group, and n=4 in the general formula (4)) were added to a mixed solution of 5.7 g of a 40% methylamine aqueous solution, 391.2 g of ultrapure water, and 945.7 g of ethanol. The mixture was allowed to react at 60° C. for four hours. After the addition of 2,681 g of propylene glycol monopropyl ether, the mixture was condensed under reduced pressure until the total amount of the solution was 758 g. Then, 38 g of a 10% propylene glycol monopropyl ether solution of acetic acid was added to obtain a composition (A-1) with a solid content of 10%.

Synthesis Example 8

68.1 g of methyltrimethoxysilane (33.4 g when converted into complete hydrolysis-condensation product), 83.3 g of tetraethoxysilane (24.2 g when converted into complete hydrolysis-condensation product), and 29.7 g of octamethylcyclotetrasiloxane (compound in which X=methyl group, Y=methyl group, and n=4 in the general formula (4)) were added to a mixed solution of 6.1 g of a 40% methylamine aqueous solution, 418.0 g of ultrapure water, and 1,140 g of ethanol. The mixture was allowed to react at 60° C. for two hours. After the addition of 3,123 g of propylene glycol monopropyl ether, the mixture was condensed under reduced pressure until the total amount of the solution was 873 g. Then, 44 g of a 10% propylene glycol monopropyl ether solution of acetic acid was added to obtain a composition (A-2) with a solid content of 10%.

Synthesis Example 9

68.1 g of methyltrimethoxysilane (33.4 g when converted into complete hydrolysis-condensation product), 93.7 g of tetraethoxysilane (27.2 g when converted into complete hydrolysis-condensation product), and 17.2 g of 1,3,5,7-tetravinyl-1,3,5,7-tetramethylcyclotetrasiloxane (compound in which X=vinyl group, Y=methyl group, and n=4 in the general formula (4)) were added to a mixed solution of 40.5 g of a 25% tetramethylammonium hydroxide aqueous solution, 769.7 g of ultrapure water, and 1,605 g of ethanol. The mixture was allowed to react at 60° C. for six hours. After the addition of 4,811 g of propylene glycol monopropyl ether, the mixture was condensed under reduced pressure until the total amount of the solution was 778 g. Then, 39 g of a 10% propylene glycol monopropyl ether solution of acetic acid was added to obtain a composition (A-3) with a solid content of 10%.

Synthesis Example 10

54.5 g of methyltrimethoxysilane (26.7 g when converted into complete hydrolysis-condensation product), 114.6 g of tetraethoxysilane (33.2 g when converted into complete hydrolysis-condensation product), and 27.2 g of 1,3,5,7-tetramethyl-1,3,5,7-tetraphenylcyclotetrasiloxane (compound in which X=methyl group, Y=phenyl group, and n=4 in the general formula (4)) were continuously added to a mixed solution of 41.6 g of a 25% tetramethylammonium hydroxide aqueous solution, 516.6 g of ultrapure water, and 2,150 g of 2-propanol at 60° C. in two hours. The mixture was allowed to react at 60° C. for six hours. After the addition of 5,396 g of propylene glycol monopropyl ether, the mixture was condensed under reduced pressure until the total amount of the solution was 871 g. Then, 44 g of a 10% propylene glycol monopropyl ether solution of acetic acid was added to obtain a composition (A-4) with a solid content of 10%.

Synthesis Example 11

40.9 g of methyltrimethoxysilane (20.0 g when converted into complete hydrolysis-condensation product), 125.0 g of tetraethoxysilane (36.3 g when converted into complete hydrolysis-condensation product), and 79.3 g of octaphenylcyclotetrasiloxane (compound in which X=phenyl group, Y=phenyl group, and n=4 in the general formula (4)) were continuously added to a mixed solution of 44.9 g of a 25% tetramethylammonium hydroxide aqueous solution, 262 g of ultrapure water, and 3,965 g of 2-propanol at 60° C. in three hours. The mixture was allowed to react at 60° C. for three hours. After the addition of 8,521 g of propylene glycol monopropyl ether, the mixture was condensed under reduced pressure until the total amount of the solution was 1,355 g. Then, 68 g of a 10% propylene glycol monopropyl ether solution of acetic acid was added to obtain a composition (A-5) with a solid content of 10%.

Comparative Example 3

68.1 g of methyltrimethoxysilane (33.4 g when converted into complete hydrolysis-condensation product) and 104.2 g of tetraethoxysilane (30.2 g when converted into complete hydrolysis-condensation product) were added to a mixed solution of 5.5 g of a 40% methylamine aqueous solution, 375.2 g of ultrapure water, and 719.3 g of ethanol. The mixture was allowed to react at 60° C. for four hours. After the addition of 2,195 g of propylene glycol monopropyl ether, the mixture was condensed under reduced pressure until the total amount of the solution was 636 g. Then, 32 g of a 10% propylene glycol monopropyl ether solution of acetic acid was added to obtain a composition (B-1) with a solid content of 10%.

Comparative Example 4

74.9 g of methyltrimethoxysilane (36.7 g when converted into complete hydrolysis-condensation product), 83.3 g of tetraethoxysilane (24.2 g when converted into complete hydrolysis-condensation product), and 24.0 g of dimethyldimethoxysilane (14.9 g when converted into complete hydrolysis-condensation product) were added to a mixed solution of 5.7 g of a 40% methylamine aqueous solution, 391.2 g of ultrapure water, and 953.2 g of ethanol. The mixture was allowed to react at 60° C. for four hours. After the addition of 2,696 g of propylene glycol monopropyl ether, the mixture was condensed under reduced pressure until the total amount of the solution was 766 g. Then, 38 g of a 10% propylene glycol monopropyl ether solution of acetic acid was added to obtain a composition (B-2) with a solid content of 10%.

TABLE 2

| | Composition | Relative dielectric constant | Degassing characteristics | Residual film rate (%) |
|---|---|---|---|---|
| Synthesis Example 7 | A-1 | 2.4 | A | 99 |
| Synthesis Example 8 | A-2 | 2.3 | A | 100 |
| Synthesis Example 9 | A-3 | 2.5 | A | 100 |
| Synthesis Example 10 | A-4 | 2.5 | A | 100 |
| Synthesis Example 11 | A-5 | 2.5 | A | 100 |
| Comparative Example 3 | B-1 | 2.4 | B | 20 |
| Comparative Example 4 | B-2 | 2.4 | B | 90 |

In Example 2, as shown in Table 2, it was confirmed that a composition exhibiting excellent chemical resistance can be obtained according to Synthesis Examples 7 to 11 by hydrolyzing and condensing the component (B) and the component (A) in the presence of the component (C-2). It was confirmed from Comparative Examples 3 and 4 that chemical resistance and degassing characteristics are decreased when the component (B) is not added.

3.3 Example 3

A film was formed by the following method using compositions (A-11 to A-16 and B-11 to B-14) obtained in this example and comparative examples.

3.3.1 Formation of Film

Each of compositions (A-11 to A-16 and B-11 to B-14) obtained in Preparation Examples 1 to 6 and Comparative Examples 5 to 8 was applied to an 8-inch silicon wafer using a spin coating method. The wafer was heated at 80° C. for five minutes in air, at 200° C. for five minutes in nitrogen atmosphere, and at 400° C. for one hour under vacuum to obtain a colorless transparent silica-based film. The resulting silica-based film was evaluated under the following conditions. The results are shown in Table 3.

3.3.2 Evaluation Method

Chemical Resistance

The wafer on which the silica-based film was formed by the above method was immersed in a 0.2 wt % diluted hydrofluoric acid aqueous solution at room temperature for one minute, and a change in thickness of the silica-based film before and after immersion was observed. The chemical resistance was judged to be excellent when the residual film rate defined below was 99% or more.

Residual film rate (%)=(thickness of silica-based film after immersion)/(thickness of silica-based film before immersion)×100

Relative Dielectric Constant

Aluminum was deposited on the wafer on which the silica-based film was formed by the above method to form a dielectric constant evaluation substrate. The relative dielectric constant was calculated from the capacitance at 10 kHz using HP 16451 B™ electrode and HP4284A™ precision LCR meter (manufactured by Yokokawa Hewlett Packard Co., Ltd).

3.3.3 Preparation of Reaction Liquid

Synthesis Example 12

In a separable flask made of quartz, 136.23 g of methyltrimethoxysilane (66.75 g when converted into complete hydrolysis-condensation product), 260.41 g of tetraethoxysilane (75.52 g when converted into complete hydrolysis-condensation product), and 74.16 g of octamethylcyclotetrasiloxane (compound in which X=methyl group, Y=methyl group, and n=4 in the general formula (4)) were added to a mixed solution of 196.88 g of a 25% tetramethylammonium hydroxide aqueous solution, 825.42 g of ultrapure water, and 2,835.5 g of ethanol. The mixture was allowed to react at 60° C. for four hours. The mixture was then cooled to room temperature. After the addition of 88.62 g of a 60% nitric acid aqueous solution to the solution, the mixture was stirred at room temperature for one hour. After the addition of 1,082.15 g of propylene glycol monopropyl ether to the solution, the mixture was condensed under reduced pressure until the total amount of the solution was 2164.3 g. Then, 108.22 g of a 10% propylene glycol monopropyl ether solution of acetic acid was added to obtain a reaction liquid 9 with a solid content of 10%.

Synthesis Example 13

In a separable flask made of quartz, 136.23 g of methyltrimethoxysilane, 260.41 g of tetraethoxysilane, and 60.13 g of 1,3,5,7-tetramethylcyclotetrasiloxane (compound in which X=hydrogen atom, Y=methyl group, and n=4 in the general formula (4)) were dissolved in 648.61 g of propylene glycol monoethyl ether. The mixture was stirred using a three one motor to stabilize the solution temperature at 50° C. Then, 243.27 g of ultrapure water, in which 0.68 g of oxalic acid was dissolved, was added to the solution in one hour. The mixture was then allowed to react at 50° C. for one hour. After the addition of 607.2 g of propylene glycol monoethyl ether, the mixture was cooled to room temperature. The mixture was condensed under reduced pressure until the total amount of the solution was 2,024.00 g to obtain a reaction liquid 10 with a solid content of 10%.

Synthesis Example 14

In a separable flask made of quartz, 163.48 g of methyltrimethoxysilane, 91.34 g of tetramethoxysilane, 68.93 g of 1,3,5,7-tetravinyl-1,3,5,7-tetramethylcyclotetrasiloxane (compound in which X=vinyl group, Y=methyl group, and n=4 in the general formula (4)), and 0.079 g of tetrakis(acetylacetonate)titanium were dissolved in 437.29 g of propylene glycol dimethyl ether. The mixture was stirred using a three one motor to stabilize the solution temperature at 50° C. Then, 162.18 g of ion-exchanged water was added to the solution in one hour. The mixture was then allowed to react at 50° C. for three hours. After the addition of 553.98 g of distilled propylene glycol dimethyl ether, the mixture was cooled to room temperature. The mixture was condensed under reduced pressure until the total amount of the solution was 1,846.6 g to obtain a reaction liquid 11 with a solid content of 10%.

Comparative Synthesis Example

In a separable flask made of quartz, 163.48 g of methyltrimethoxysilane and 166.66 g of tetraethoxysilane were dissolved in 341.99 g of propylene glycol monoethyl ether. The mixture was stirred using a three one motor to stabilize the solution temperature at 50° C. Then, 183.80 g of ultrapure water, in which 0.34 g of oxalic acid was dissolved, was added to the solution in one hour. The mixture was then allowed to react at 50° C. for one hour. After the addition of 385.32 g of propylene glycol monoethyl ether, the mixture was cooled to room temperature. The mixture was condensed under reduced pressure until the total amount of the solution was 1,284.40 g to obtain a reaction liquid 12 with a solid content of 10%.

3.3.4 Preparation of Composition

Preparation Example 1

4.5 g of polyethylene glycol monoundecanoic acid ester (number of repeating oxyethylene units=10) was dissolved in 100 g of the reaction liquid 9 obtained in Synthesis Example 12. The mixture was filtered using a filter made of Teflon (registered trademark) with a pore size of 0.2 μm to obtain a film forming composition (A-11) of Preparation Example 1.

Preparation Example 2

3.0 g of a 2-ethylhexyl methacrylate-2-hydroxyethyl methacrylate copolymer (copolymerization molar ratio=70:30) with a molecular weight of 10,000 was dissolved in 100 g of the reaction liquid 9 obtained in Synthesis Example 12. The mixture was filtered using a filter made of Teflon (registered trademark) with a pore size of 0.2 μm to obtain a film forming composition (A-12) of Preparation Example 2.

Preparation Example 3

5.0 g of a polyoxyethylene-polyoxypropylene-polyoxyethylene block copolymer (Newpol PE61 (HO-PEO$_2$-PPO$_{70}$-PEO$_2$-OH) manufactured by Sanyo Chemical Industries, Ltd.,) was dissolved in 100 g of the reaction liquid 10 obtained in Synthesis Example 13. The mixture was filtered using a filter made of Teflon (registered trademark) with a pore size of 0.2 μm to obtain a film forming composition (A-13) of Preparation Example 3.

Preparation Example 4

3.0 g of tert-butyl methacrylate-2-hydroxyethyl methacrylate copolymer (copolymerization molar ratio=30:70) with a molecular weight of 8,900 was dissolved in 100 g of the reaction liquid 10 obtained in Synthesis Example 13. The mixture was filtered using a filter made of Teflon (registered trademark) with a pore size of 0.2 μm to obtain a film forming composition (A-14) of Preparation Example 4.

Preparation Example 5

4.5 g of a polyoxyethylene-polyoxypropylene-polyoxyethylene block copolymer (Newpol PE61 (HO-PEO$_2$-PPO$_{70}$-PEO$_2$-OH) manufactured by Sanyo Chemical Industries, Ltd.,) was dissolved in 100 g of the reaction liquid 11 obtained in Synthesis Example 14. The mixture was filtered using a filter made of Teflon (registered trademark) with a pore size of 0.2 μm to obtain a film forming composition (A-15) of Preparation Example 5.

Preparation Example 6

4.5 g of tert-butyl methacrylate-2-hydroxyethyl acrylate copolymer (copolymerization molar ratio=30:70) with a molecular weight of 13,000 was dissolved in 100 g of the reaction liquid 11 obtained in Synthesis Example 14. The mixture was filtered using a filter made of Teflon (registered trademark) with a pore size of 0.2 μm to obtain a film forming composition (A-16) of Preparation Example 6.

Comparative Example 5

The reaction liquid 9 obtained in Synthesis Example 12 was filtered using a filter made of Teflon (registered trademark) with a pore size of 0.2 μm to obtain a film forming composition (B-11) of Comparative Example 5.

Comparative Example 6

The reaction liquid 10 obtained in Synthesis Example 13 was filtered using a filter made of Teflon (registered trademark) with a pore size of 0.2 μm to obtain a film forming composition (B-12) of Comparative Example 6.

Comparative Example 7

4.5 g of polyethylene glycol monoundecanoic acid ester (number of repeating oxyethylene units=10) was dissolved in 100 g of the reaction liquid 12 obtained in Comparative Synthesis Example. The mixture was filtered using a filter made of Teflon (registered trademark) with a pore size of 0.2 μm to obtain a film forming composition (B-13) of Comparative Example 7.

Comparative Example 8

3.0 g of 2-ethylhexyl methacrylate-2-hydroxyethyl methacrylate copolymer (copolymerization molar ratio=70:30) with a molecular weight of 10,000 was dissolved in 100 g of the reaction liquid 12 obtained in Comparative Synthesis Example. The mixture was filtered using a filter made of Teflon (registered trademark) with a pore size of 0.2 μm to obtain a film forming composition (B-14) of Comparative Example 8.

TABLE 3

| | Composition | Relative dielectric constant | Residual film rate (%) |
|---|---|---|---|
| Preparation Example 1 | A-11 | 2.1 | 100 |
| Preparation Example 2 | A-12 | 2.0 | 100 |
| Preparation Example 3 | A-13 | 2.2 | 100 |

TABLE 3-continued

| | Composition | Relative dielectric constant | Residual film rate (%) |
|---|---|---|---|
| Preparation Example 4 | A-14 | 2.3 | 100 |
| Preparation Example 5 | A-15 | 2.0 | 100 |
| Preparation Example 6 | A-16 | 2.1 | 100 |
| Comparative Example 5 | B-11 | 2.9 | 100 |
| Comparative Example 6 | B-12 | 3.3 | 100 |
| Comparative Example 7 | B-13 | 2.3 | 0 |
| Comparative Example 8 | B-14 | 2.2 | 0 |

In Example 3, as shown in Table 3, according to Preparation Examples 1 to 6, it was confirmed that a silica-based film having a low relative dielectric constant and exhibiting excellent chemical resistance can be obtained by using a film forming composition which includes the hydrolysis-condensation product (I), the compound (II) which is compatible with or dispersed in the hydrolysis-condensation product (I) and has a boiling point or decomposition temperature of 200 to 400° C., and the organic solvent (III). It was confirmed from Comparative Examples 5 and 6 that the relative dielectric constant is increased when the compound (II) is not added. It was confirmed from Comparative Examples 7 and 8 that chemical resistance is decreased when the hydrolysis-condensation product (I) obtained by hydrolyzing and condensing the component (A) and the component (B) is not added.

What is claimed is:

1. A process for producing a film forming composition comprising hydrolyzing and condensing:

(A) at least one silane compound selected from a compound (A-1) shown by the following general formula (1), a compound (A-2) shown by the following general formula (2), and a compound (A-3) shown by the following general formula (3), $$R_a Si(OR^1)_{4-a} \quad (1)$$

wherein R represents a hydrogen atom, a fluorine atom, or a monovalent organic group, $R^1$ represents a monovalent organic group, and a represents 1 or 2;

$$Si(OR^2)_4 \quad (2)$$

wherein $R^2$ represents a monovalent organic group;

$$R^3_b(R^4O)_{3-b}Si-(R^7)_d-Si(OR^5)_{3-c}R^6_c \quad (3)$$

wherein $R^3$, $R^4$, $R^5$, and $R^6$ individually represent a monovalent organic group, b and c individually represent an integer of 0 to 2, $R^7$ represents an oxygen atom, a phenylene group, or a group —$(CH_2)_m$— (wherein m represents an integer of 1 to 6), and d represents 0 or 1; and (B) a cyclic silane compound shown by the following general formula (4)

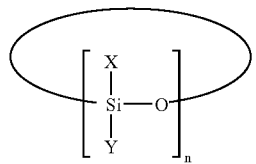

wherein X and Y individually represent a hydrogen atom, an alkyl group, aryl group, allyl group, or a glycidyl group, and n represents an integer of 2 to 8, wherein the hydrolysis and condensation are carried out in the presence of (C-1) a metal chelate compound shown by the following general formula (5):

$$R^8_e M(OR^9)_{f-e} \quad (5)$$

wherein $R^8$ represents a chelating agent, M represents a metal atom, $R^9$ represents an alkyl group having 2 to 5 carbon atoms or an aryl group having 6 to 20 carbon atoms, f represents the valence of the metal M, and e represents an integer of 1 to f, wherein the concentration of the component (A) and the component (B) at the time of the hydrolysis and condensation is 1 to 30 wt % converted into complete hydrolysis-condensation product.

2. The process for producing a film forming composition as defined in claim 1,
wherein the amount of the component (B) is 1 to 200 parts by weight for 100 parts by weight of the component (A) (converted into complete hydrolysis-condensation product).

3. The process for producing a film forming composition as defined in claim 1, wherein the amount of the component (C-1) is 0.0001 to 10 parts by weight for 100 parts by weight of the total amount of the component (A) and the component (B) (converted into complete hydrolysis-condensation product) at the time of the hydrolysis and condensation.

4. The process for producing a film forming composition as defined in claim 1,
wherein the hydrolysis and condensation are carried out in the presence of (D-1) water; and
wherein an amount of the water (D-1) to be used is 0.5 to 10 mol for 1 mol of the total amount of the component (A) and the component (B).

5. The process for producing a film forming composition as defined in claim 1,
wherein the hydrolysis and condensation are carried out in the presence of (F) an organic solvent shown by the following general formula (6):

$$R^{10}O(CHCH_3CH_2O)_g R^{11} \quad (6)$$

wherein $R^{10}$ and $R^{11}$ are independently of one another selected from the group consisting of a hydrogen atom, or a monovalent alkyl groups having 1 to 4 carbon atoms and $CH_3CO$—, and g is 1 or 2.

6. A film forming composition comprising:

(I) a hydrolysis-condensation product obtained by hydrolyzing and condensing (A) at least one silane compound selected from a compound (A-1) shown by the following general formula (1), a compound (A-2) shown by the following general formula (2), and a compound (A-3) shown by the following general formula (3), $$R_a Si(OR^1)_{4-a} \quad (1)$$

wherein R represents a hydrogen atom, a fluorine atom, or a monovalent organic group, $R^1$ represents a monovalent organic group, and a represents 1 or 2, $$Si(OR^2)_4 \qquad (2)$$

wherein $R^2$ represents a monovalent organic group;

$$R^3{}_b(R^4O)_{3-b}Si—(R^7)_d—Si(OR^5)_{3-c}R^6{}_c \qquad (3)$$

wherein $R^3$, $R^4$, $R^5$, and $R^6$ individually represent a monovalent organic group, b and c individually represent an integer of 0 to 2, $R^7$ represents an oxygen atom, a phenylene group, or a group —$(CH_2)_m$— (wherein m represents an integer of 1 to 6), and d represents 0 or 1; and (B) a cyclic silane compound shown by the following general formula (4),

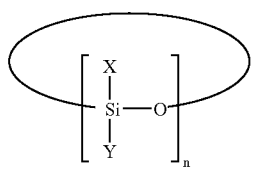

(4)

wherein X and Y individually represent a hydrogen atom an alkyl group, aryl group allyl group, or glycidyl group and n represents an integer of 2 to 8;

(II) a compound which is compatible with or dispersed in the hydrolysis-condensation product (I) and has a boiling point or decomposition temperature of 200 to 400° C., and (III) an organic solvent, wherein the hydrolysis and condensation are carried out in the presence of (C-1) a metal chelate compound shown by the following general formula (5):

$$R^8{}_eM(OR^9)_{f-e} \qquad (5)$$

wherein $R^8$ represents a chelating agent, M represents a metal atom, $R^9$ represents an alkyl group having 2 to 5 carbon atoms or an aryl group having 6 to 20 carbon atoms, f represents the valence of the metal M, and e represents an integer of 1 to f.

7. The film forming composition as defined in claim 6, wherein the compound (II) is a compound having a polyalkylene oxide structure or a (meth)acrylic polymer.

8. The film forming composition as defined in claim 7, wherein the polyalkylene oxide structure is at least one structure selected from the group consisting of a polymethylene oxide structure, a polyethylene oxide structure, a a polypropylene oxide structure, a polytetramethylene oxide structure, and polybutylene oxide structure.

9. The film forming composition as defined in claim 7, wherein the (meth)acrylic polymer is obtained by polymerizing a compound shown by the following general formula (7) and a compound shown by the following general formula (8):

$$CH_2=CR^{12}COOR^{13} \qquad (7)$$

wherein $R^{12}$ represents a hydrogen atom or a methyl group, and $R^{13}$ represents a monovalent aliphatic hydrocarbon group;

$$CH_2=CR^{14}COOR^{15} \qquad (8)$$

wherein $R^{14}$ represents a hydrogen atom or a methyl group, and $R^{15}$ represents a functional group including a heteroatom.

10. The film forming composition as defined in claim 6, wherein the organic solvent (III) is an alkylene glycol solvent.

11. The film forming composition as defined in claim 6, wherein the amount of the compound (II) is 5 to 200 parts by weight for 100 parts by weight of the hydrolysis-condensation product (I) converted into complete hydrolysis-condensation product.

12. The film forming composition as defined in claim 6, further comprising at least one selected from the group consisting of a fluorine-containing surfactant and/or a silicone-containing surfactant (IV).

13. A process for forming a film, comprising: applying the film forming composition as defined in claim 6 to a substrate to form a film; and subjecting the film to at least one type of processing selected from the group consisting of heating, electron beam irradiation, ultraviolet irradiation, and oxygen plasma processing.

14. A process for forming a film, comprising:

applying the film forming composition as defined in claim 6 to a substrate to form a film;

heating the film at a temperature less than the boiling point or decomposition temperature of the compound (II) to partially cure the film; and completely curing the film by subjecting the film to at least one type of processing selected from the group consisting of heating, electron beam irradiation, ultraviolet irradiation, and oxygen plasma processing at a temperature equal to or higher than the boiling point or decomposition temperature of the compound (II).

15. A silica-based film obtained by the process for forming a film as defined in claim 13.

16. A silica-based film obtained by the process for forming a film as defined in claim 14.

* * * * *